United States Patent
Sato

(10) Patent No.: US 12,537,131 B2
(45) Date of Patent: Jan. 27, 2026

(54) ELECTRONIC COMPONENT

(71) Applicant: TDK CORPORATION, Tokyo (JP)

(72) Inventor: Takuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 592 days.

(21) Appl. No.: 18/169,279

(22) Filed: Feb. 15, 2023

(65) Prior Publication Data

US 2023/0307175 A1    Sep. 28, 2023

(30) Foreign Application Priority Data

Mar. 28, 2022 (JP) .................................. 2022-051991

(51) Int. Cl.
*H01F 27/32* (2006.01)
*H01F 27/28* (2006.01)
*H03H 7/01* (2006.01)

(52) U.S. Cl.
CPC ....... *H01F 27/323* (2013.01); *H01F 27/2804* (2013.01); *H03H 7/0115* (2013.01); *H01F 2027/2809* (2013.01)

(58) Field of Classification Search
CPC ............... H01F 27/323; H01F 27/2804; H01F 2027/2809; H01F 27/34; H01F 2017/0026; H01F 2017/006; H01F 17/0013; H03H 7/0115; H03H 2001/0085; H03H 7/09; H03H 7/1708; H03H 7/1766; H03H 7/1775; H03H 7/46
See application file for complete search history.

(56) References Cited

U.S. PATENT DOCUMENTS

| | | | |
|---|---|---|---|
| 9,275,786 B2 * | 3/2016 | Berdy | H01F 17/0013 |
| 12,217,897 B2 * | 2/2025 | Oshima | H01F 17/0013 |
| 2015/0235753 A1 * | 8/2015 | Chatani | H01F 27/2804 |
| | | | 336/200 |
| 2017/0373396 A1 | 12/2017 | Kato et al. | |

FOREIGN PATENT DOCUMENTS

| | | |
|---|---|---|
| JP | 2005-039187 A | 2/2005 |
| JP | 2015-141945 A | 8/2015 |

* cited by examiner

*Primary Examiner* — Tuyen T Nguyen
(74) *Attorney, Agent, or Firm* — Oliff PLC

(57) ABSTRACT

In an electronic component, a plurality of conductor layers extend in a direction that intersects a coil axis and that is along insulator layers. Each of the plurality of connection conductors is connected to a corresponding conductor layer among the plurality of conductor layers, and extends in a stacking direction. In the conductor layers adjacent to each other in a direction along the coil axis among the plurality of conductor layers, a width in a direction orthogonal to an extending direction of each of the conductor layers is larger than a shortest distance between the conductor layers adjacent to each other. An extending direction of each of first conductor layers and an extending direction of at least one second conductor layer intersect each other when viewed in the stacking direction, and are inclined to a direction that is orthogonal to the coil axis and that is along the insulator layers.

7 Claims, 16 Drawing Sheets

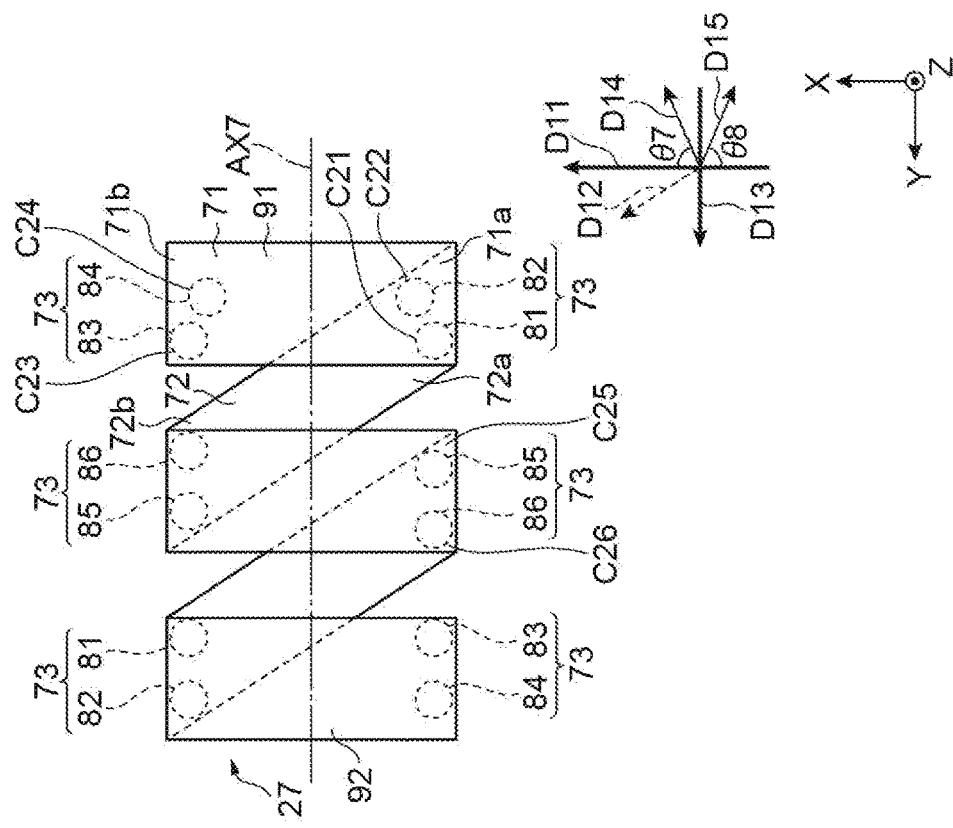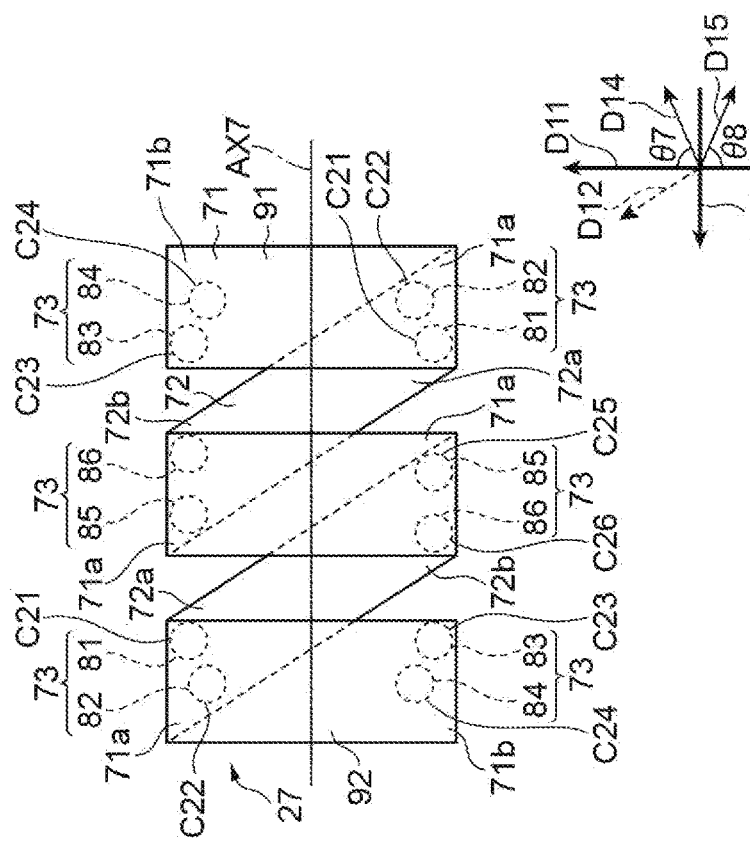

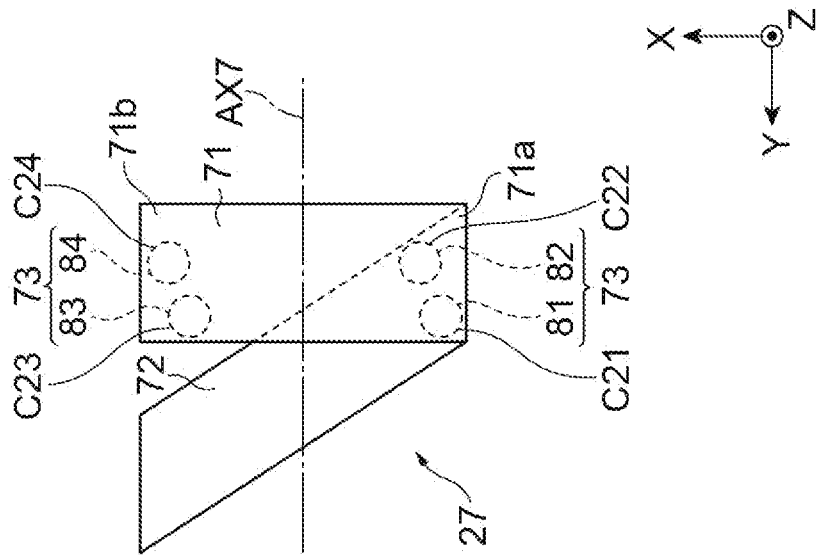
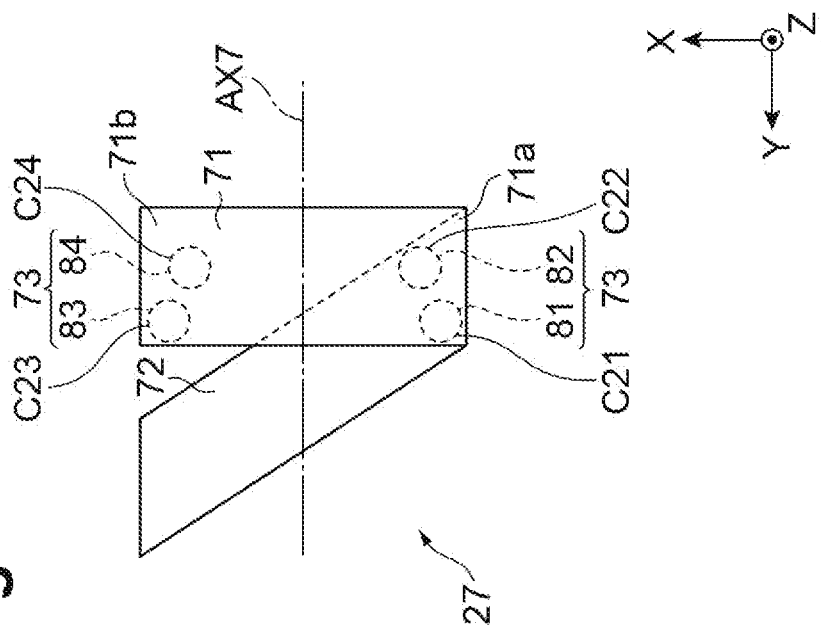

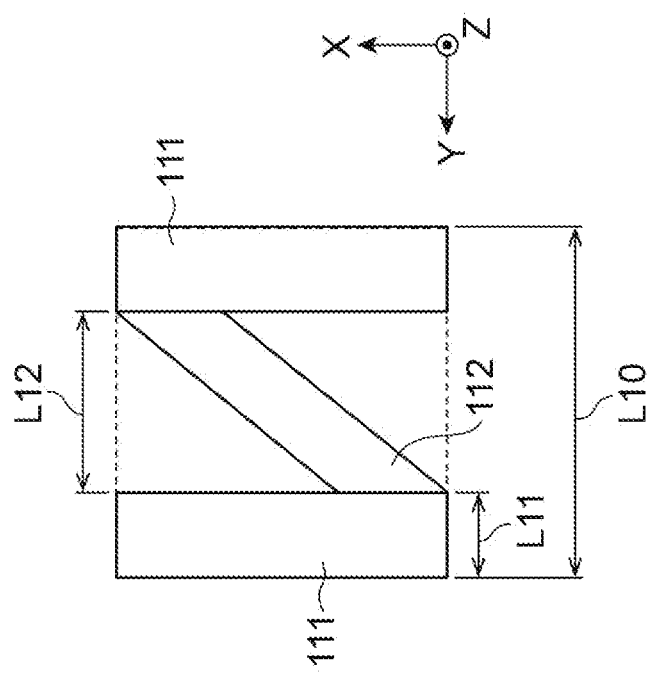
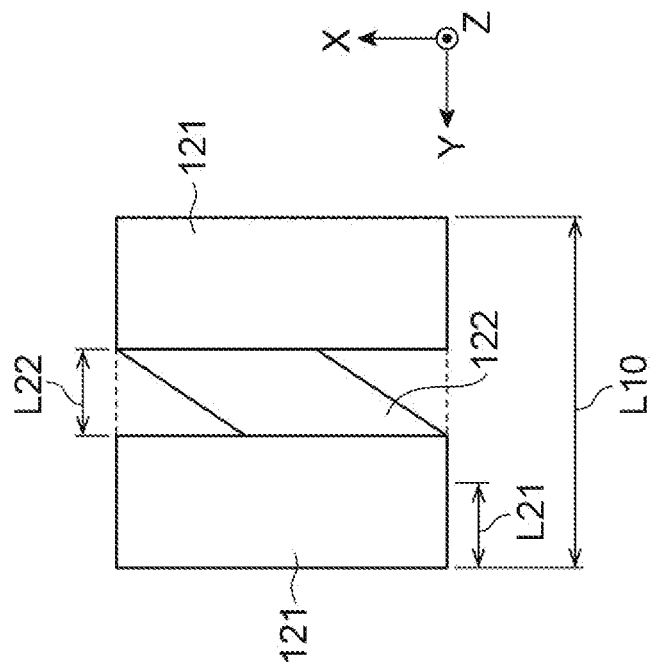

ELECTRONIC COMPONENT

TECHNICAL FIELD

The present invention relates to an electronic component.

BACKGROUND

A known electronic component includes an element body and a coil. The element body includes a plurality of insulator layers that are stacked. The coil is disposed inside the element body. For example, the coil includes a plurality of conductor layers and a plurality of connection conductors. For example, in Japanese Unexamined Patent Publication No. 2015-141945, the plurality of conductor layers extend in a direction that intersects a coil axis and that is along a stacking direction of the insulator layers. Each of the plurality of connection conductors is connected to the corresponding conductor layer among the plurality of conductor layers, and extends in the stacking direction. The plurality of conductor layers include a plurality of first conductor layers and a second conductor layer. The plurality of first conductor layers are arranged along the coil axis. The second conductor layer is disposed at a position different from that of the plurality of first conductor layers in the stacking direction, and is connected to the corresponding first conductor layer among the plurality of first conductor layers through the connection conductor.

A coil having desired characteristics is considered. Characteristics of the coil are related to inductance. Therefore, in order to ensure the desired characteristics, designing the coil to obtain a desired inductance is required. The larger a width of the conductor layer is, the smaller the inductance is. However, when the conductor layers are disposed in element bodies having the same size, the larger the width of the conductor layers is, the more a shortest distance between the conductor layers adjacent to each other is reduced. When the distance between the conductor layers is too small, for example, a stray capacitance is generated between the conductor layers, which is a problem. When a stray capacitance is generated, it is difficult to obtain the desired characteristics.

SUMMARY

According to one aspect, an object of the present invention is to provide an electronic component capable of achieving both compactness and the realization of desired characteristics.

An electronic component in one aspect of the present invention includes an element body and a coil. The element body includes a plurality of insulator layers that are stacked. The coil is disposed inside the element body. The coil forms a coil axis along a direction orthogonal to a stacking direction of the plurality of insulator layers. The coil includes a plurality of conductor layers and a plurality of connection conductors. The plurality of conductor layers extend in a direction that intersects the coil axis and that is along insulator layers. Each of the plurality of connection conductors is connected to the corresponding conductor layer among the plurality of conductor layers, and extends in the stacking direction. The plurality of conductor layers include a plurality of first conductor layers and at least one second conductor layer. The plurality of first conductor layers are arranged along the coil axis. The at least one second conductor layer is disposed at a position different from a position of the plurality of first conductor layers in the stacking direction. The at least one second conductor layer is connected to the corresponding first conductor layer among the plurality of first conductor layers through the connection conductor. In the conductor layers adjacent to each other in a direction along the coil axis among the plurality of conductor layers, a width in a direction orthogonal to an extending direction of each of the conductor layers is larger than a shortest distance between the conductor layers adjacent to each other. An extending direction of each of the first conductor layers and an extending direction of the at least one second conductor layer intersect each other when viewed in the stacking direction, and are inclined to a direction that is orthogonal to the coil axis and that is along the insulator layers.

In the electronic component, in the conductor layers adjacent to each other in the direction along the coil axis among the plurality of conductor layers, the width in the direction orthogonal to the extending direction of each of the conductor layers is larger than the shortest distance between the conductor layers adjacent to each other. The extending direction of each of the first conductor layers and the extending direction of the at least one second conductor layer intersect each other when viewed in the stacking direction, and are inclined to the direction that is orthogonal to the coil axis and that is along the insulator layers. According to this configuration, the conductor layers are disposed to reduce a length of an electric current path in the coil while ensuring a relatively large width of the conductor layers. The shorter the electric current path in the coil is, the further inductance can be reduced. Therefore, the conductor layers included in the coil of the electronic component are configured to reduce inductance. Therefore, it is possible to achieve both the compactness of and the realization of desired characteristics of the electronic component.

In the one aspect, the plurality of first conductor layers may include a pair of the first conductor layers. The pair of first conductor layers may be connected to each other through the second conductor layer. In this case, the length of the electric current path in the coil can be reduced in a simpler configuration.

In the one aspect, the pair of first conductor layers may be the conductor layers adjacent to each other in the direction along the coil axis among the plurality of conductor layers. In this case, the length of the electric current path in the coil can be reduced in a simpler configuration.

In the one aspect, the first conductor layer and the second conductor layer connected to each other through the connection conductor may be line-symmetrically disposed when viewed in the stacking direction. In this case, electric current easily flows in a distributed manner, and loss of electric current can be reduced. When electric current flows in a distributed manner, electric current density decreases, and a Q value of the coil is also improved.

In the one aspect, each of the conductor layers may include a pair of end portions located opposite each other. The plurality of connection conductors may include a first connection conductor and a second connection conductor. The first connection conductor and the second connection conductor may be connected to at least one of the pair of end portions. In this case, electric current can flow through the first connection conductor and through the second connection conductor in a distributed manner, and loss of electric current can be further reduced. In this case, the Q value of the coil can also be further improved.

In the one aspect, among the plurality of first conductor layers and the at least one second conductor layer, the first conductor layer and the second conductor layer corresponding to each other may be connected to each other through the first connection conductor and through the second connection conductor. A first connection portion at which the first connection conductor and the end portion are connected to each other and a second connection portion at which the second connection conductor and the end portion are connected to each other may be arranged in a direction inclined to the extending directions of the first conductor layer and the second conductor layer connected to the first connection conductor and to the second connection conductor. In this case, electric current can flow through the first connection conductor and through the second connection conductor in a distributed manner and in a more balanced manner, and loss of electric current can be further reduced. In this case, the Q value of the coil can also be further improved.

In the one aspect, an angle formed by an arrangement direction of the first connection portion and the second connection portion in the first conductor layer and the extending direction of the first conductor layer may be equal to an angle formed by an arrangement direction of the first connection portion and the second connection portion in the second conductor layer and the extending direction of the second conductor layer. In this case, electric current can flow through the first connection conductor and through the second connection conductor in a distributed manner and in a more balanced manner, and loss of electric current can be further reduced. In this case, the Q value of the coil can also be further improved.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 10A is a schematic plan view of the coil in the electronic component in the present embodiment.

FIG. 10B is a schematic plan view of a coil in an electronic component in a modification example of the present embodiment.

FIGS. 12A and 12B are schematic plan views of coils in electronic components in modification examples of the present embodiment.

FIGS. 13A and 13B illustrate comparative examples of schematic plan views of coils.

DETAILED DESCRIPTION

Hereinafter, an embodiment of the present invention will be described in detail with reference to the accompanying drawings. In the description of the drawings, the same reference signs will be used for the same or equivalent elements, and duplicated descriptions will not be repeated.

Figure 1:
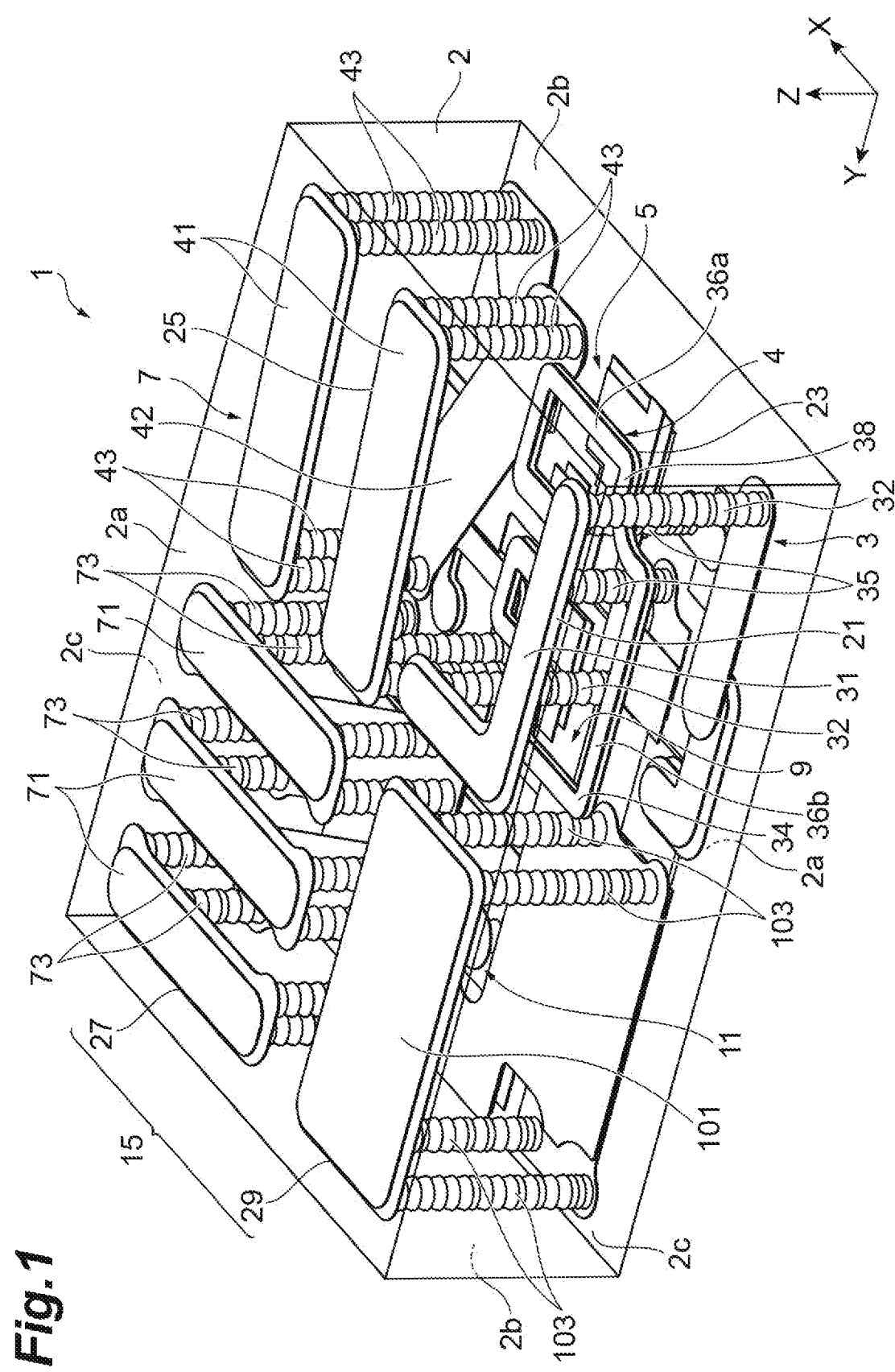
FIG. 1 is a perspective view of an electronic component in the present embodiment.
Figure 2:
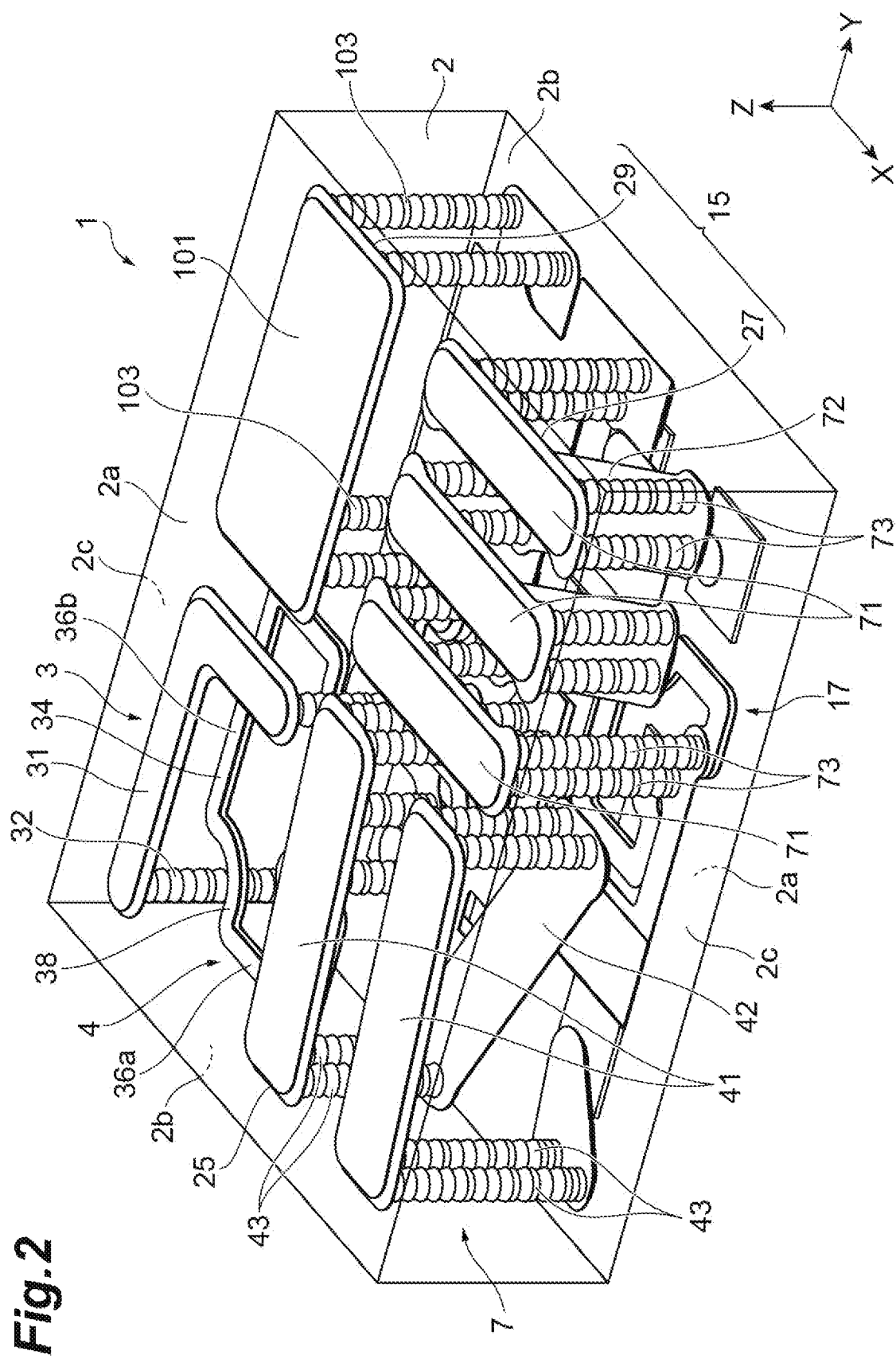
FIG. 2 is a perspective view of the electronic component.
Figure 3:
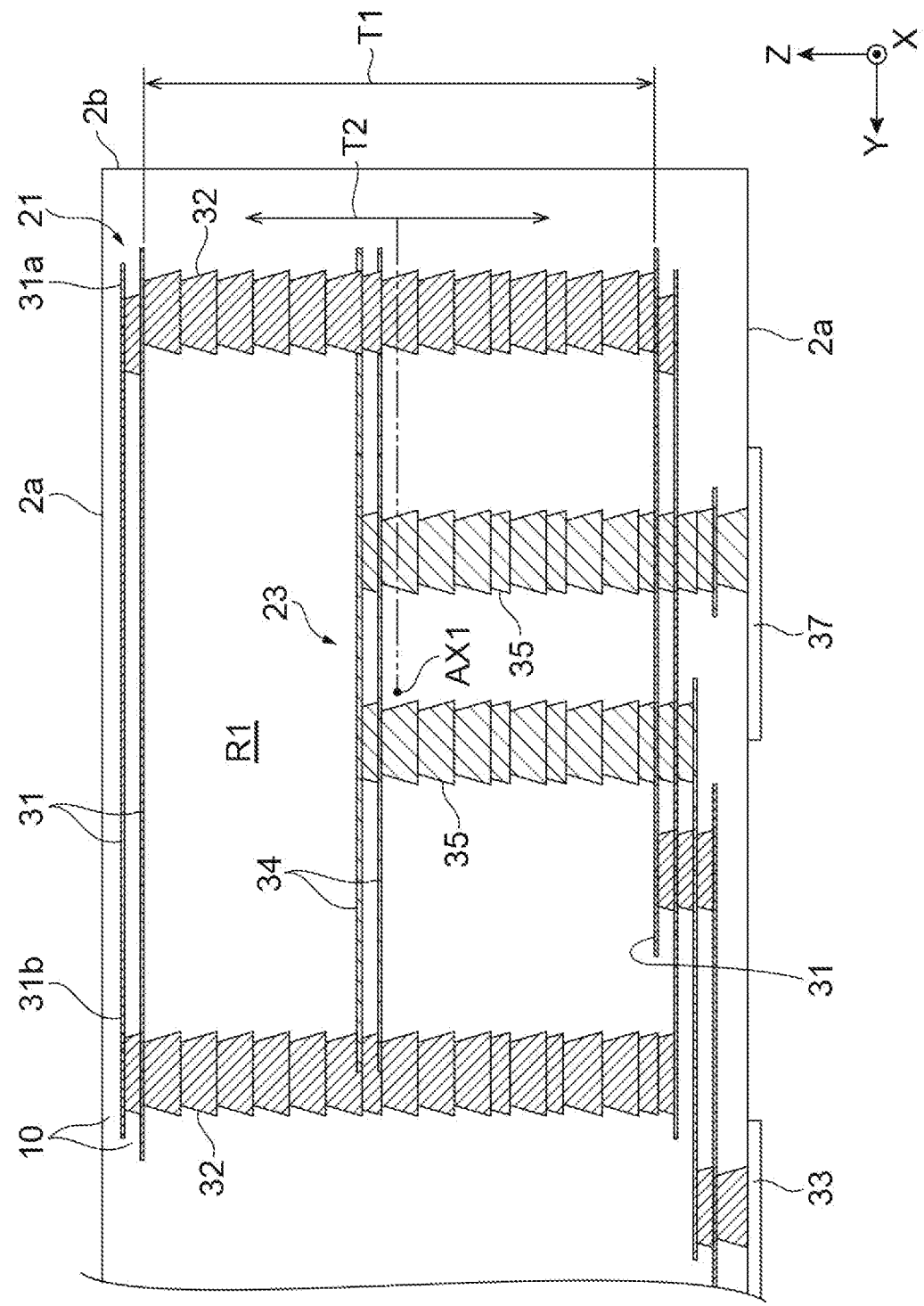
FIG. 3 is a partial cross-sectional view of the electronic component.
Figure 4:
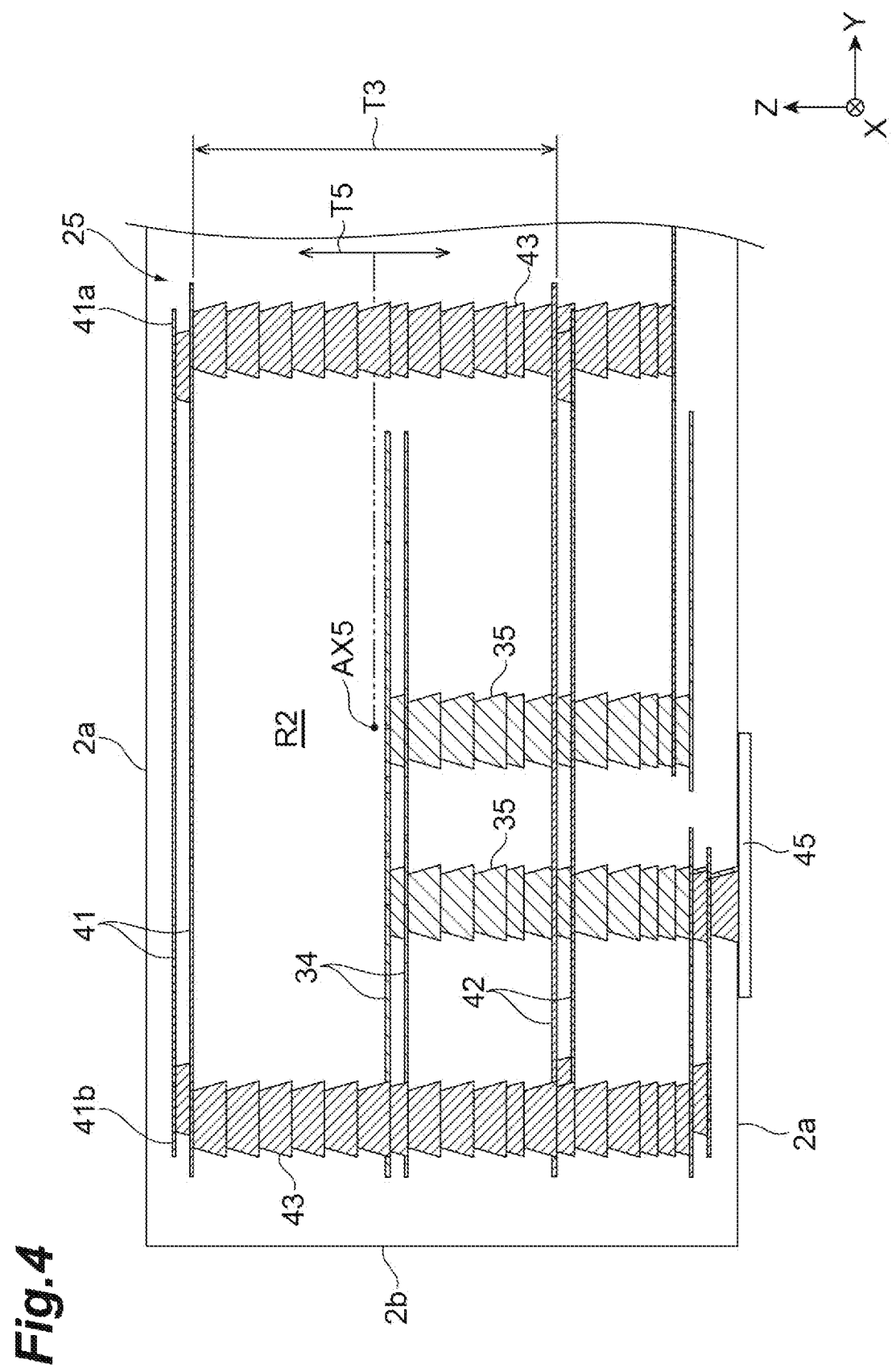
FIG. 4 is a partial cross-sectional view of the electronic component.
Figure 5:
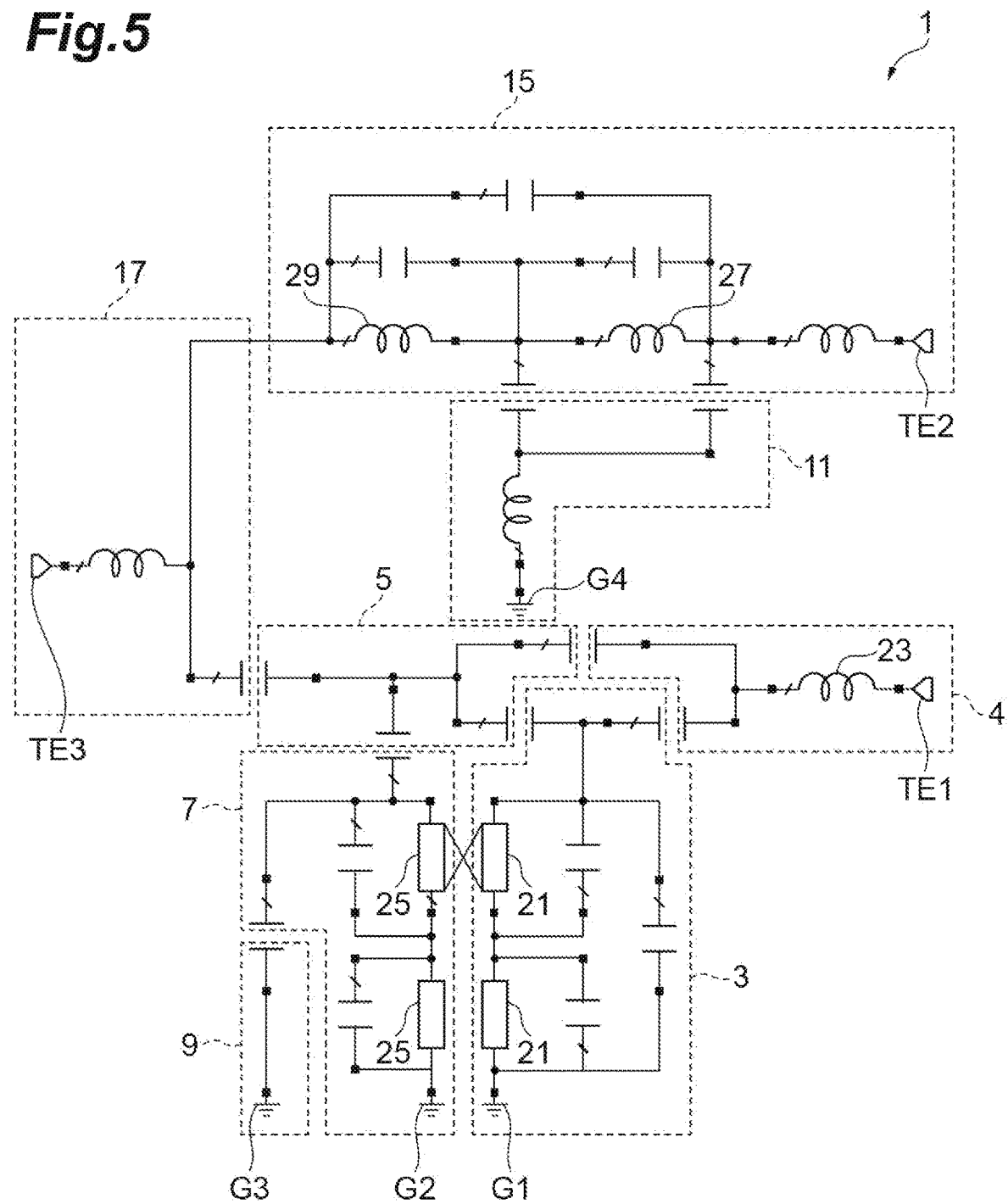
FIG. 5 is a circuit diagram of the electronic component.
Figure 6:
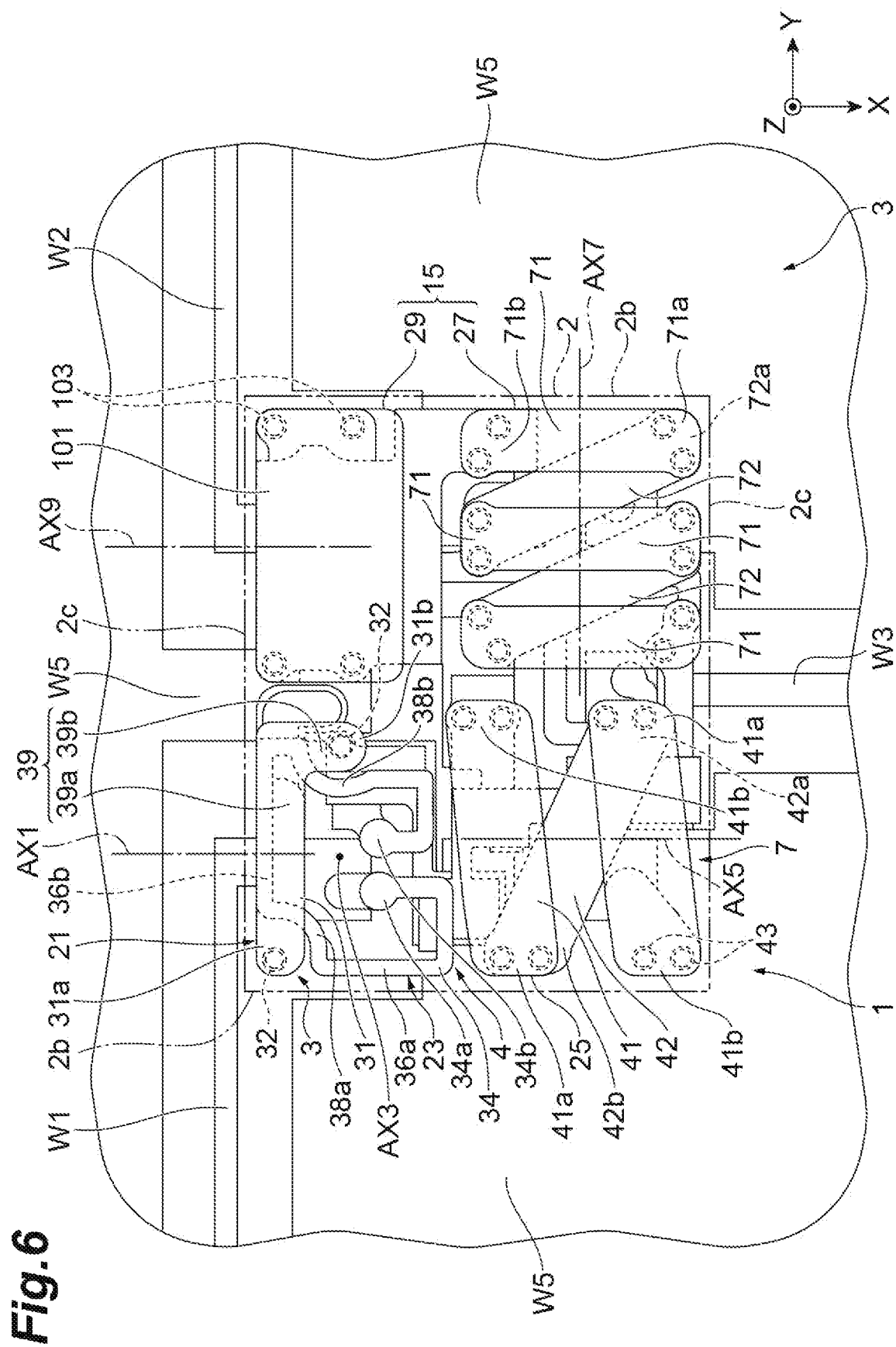
FIG. 6 is a plan view of the electronic component in a mounted state.

First, an electronic component in the present embodiment will be described with reference to FIGS. 1 to 6. FIGS. 1 and 2 are perspective views of the electronic component in the present embodiment. FIGS. 3 and 4 are partial cross-sectional views of the electronic component. FIG. 5 is a circuit diagram of the electronic component. FIG. 6 is a plan view of the electronic component in a mounted state.

An electronic component 1 is, for example, a multilayer filter. The electronic component 1 includes a plurality of LC resonance circuits. Each of the LC resonance circuits is formed of a plurality of inductors and a plurality of capacitors. The electronic component 1 includes, for example, an element body 2 and electric circuits 3, 4, 5, 7, 9, 11, 15, and 17. In the present embodiment, a Z-axis direction corresponds to a height direction, and an X-axis direction and a Y-axis direction correspond to a lateral direction and a longitudinal direction of the electronic component 1, respectively. For example, a length of the electronic component 1 in the height direction is shorter than a length of the electronic component 1 in the lateral direction.

The element body 2 has a pair of main surfaces 2a, a pair of end surfaces 2b, and a pair of side surfaces 2c as outer surfaces. The pair of main surfaces 2a face each other in the Z-axis direction. The pair of end surfaces 2b face each other in the Y-axis direction. The pair of side surfaces 2c face each other in the X-axis direction. Each of the pair of main surfaces 2a, the pair of end surfaces 2b, and the pair of side surfaces 2c is, for example, a flat surface. The pair of main surfaces 2a are, for example, along the X-axis direction and along the Y-axis direction. The pair of end surfaces 2b are, for example, along the X-axis direction and along the Z-axis direction. The pair of side surfaces 2c are, for example, along the Y-axis direction and along the Z-axis direction. For example, when the electronic component 1 is mounted on another electronic device, one of the pair of main surfaces 2a is defined as a mounting surface facing the another electronic device. The another electronic device includes, for example, a circuit substrate or an electronic component.

The element body 2 has, for example, a rectangular parallelepiped shape. The rectangular parallelepiped shape includes a rectangular parallelepiped shape of which corners and ridge portions are chamfered, and a rectangular parallelepiped shape of which corners and ridge portions are rounded.

As illustrated in FIGS. 3 and 4, the element body 2 includes a plurality of insulator layers 10. The plurality of insulator layers 10 are stacked in the Z-axis direction. In the electronic component 1, the Z-axis direction corresponds to a stacking direction of the plurality of insulator layers 10. Hereinafter, the stacking direction of the plurality of insulator layers 10 is simply referred to as the "stacking direction". The insulator layers 10 are integrated to such an extent that a gap therebetween cannot be visually recognized. Each of the insulator layers 10 is formed of, for example, a sintered body of ceramic green sheets containing a dielectric material. The dielectric material contains at least one selected from, for example, a $BaTiO_3$-based material, a $Ba(Ti,Zr)O_3$-based material, a $(Ba,Ca)TiO_3$-based material, a glass material, and an alumina material.

As illustrated in FIG. 5, the electric circuits 3, 4, 5, 7, 9, 11, 15, and 17 are electrically connected to each other inside the element body 2, and form one filter circuit. In this specification, "being electrically connected" includes a state where a direct current component is not transmitted and only an alternating current component is transmitted. Each of the electric circuits 3, 4, 5, 7, 9, 11, 15, and 17 includes a plurality of terminal electrodes TE1, TE2, TE3, G1, G2, G3, and G4 exposed from the element body 2. The plurality of terminal electrodes TE1, TE2, TE3, G1, G2, G3, and G4 are disposed on the main surface 2a that is a mounting surface. Each of the plurality of terminal electrodes TE1, TE2, TE3, G1, G2, G3, and G4 is electrically connected to the another electronic device.

For example, as illustrated in FIG. 6, the electronic component 1 is mounted on a substrate S. The substrate S includes wirings W1, W2, W3, and W5. Each of the wirings W1, W2, W3, and W5 is connected to a corresponding terminal electrode among the plurality of terminal electrodes of the electronic component 1. The wiring W1 is connected to the terminal electrode TE1. The wiring W2 is connected to the terminal electrode TE2. The wiring W3 is connected to the terminal electrode TE3. The wiring W5 is connected to the terminal electrodes G1, G2, G3, and G4. The wiring W5 corresponds to the ground.

Each of the electric circuits 3, 4, 7, 11, 15, and 17 includes inductors. The electric circuit 3 includes the terminal electrode G1, and forms a capacitor between the electric circuit 3 and each of the electric circuit 4 and the electric circuit 5. The electric circuit 4 includes the terminal electrode TE1, and forms a capacitor between the electric circuit 4 and each of the electric circuit 3 and the electric circuit 5. The electric circuit 5 forms a capacitor between the electric circuit 5 and each of the electric circuit 3, the electric circuit 4, the electric circuit 7, and the electric circuit 17. The electric circuit 7 includes the terminal electrode G2, and forms a capacitor between the electric circuit 7 and each of the electric circuit 5 and the electric circuit 9. The electric circuit 9 includes the terminal electrode G3, and forms a capacitor between the electric circuit 9 and the electric circuit 7. The electric circuit 11 includes the terminal electrode G4, and forms a capacitor between the electric circuit 11 and the electric circuit 15. The electric circuit 15 includes the terminal electrode TE2, and forms a capacitor between the electric circuit 15 and the electric circuit 11. The electric circuit 17 includes the terminal electrode TE3, and forms a capacitor between the electric circuit 17 and the electric circuit 5. The electric circuit 15 and the electric circuit 17 are electrically and physically connected to each other.

Each of the electric circuits 3, 4, 5, 7, 9, 11, 15, and 17 is formed of a plurality of conductors. The conductors forming each of the electric circuits 3, 4, 5, 7, 9, 11, 15, and 17 contain, for example, at least one selected from Ag and Pd. Each of the electric circuits 3, 4, 5, 7, 9, 11, 15, and 17 includes the plurality of terminal electrodes exposed from the element body 2. A plating layer is formed on a surface of each of the terminal electrodes. The plating layer is formed, for example, by electroplating. The plating layer has a layer structure formed of a Cu plating layer, a Ni plating layer, and a Sn plating layer, a layer structure formed of a Ni plating layer and a Sn plating layer, or the like.

Each of the electric circuits 3, 4, 5, 7, 9, 11, 15, and 17 is disposed inside the element body 2 except for the plurality of terminal electrodes TE1, TE2, TE3, G1, G2, G3, and G4. In the example illustrated in the present embodiment, a length of the element body 2 in the X-axis direction is 2000 μm. A length of the element body 2 in the Y-axis direction is 2500 μm. A length of the element body 2 in the Z-axis direction is 750 μm. Each of the electric circuits 3, 4, 5, 7, 9, 11, 15, and 17 is apart from the outer surfaces of the element body 2 other than the mounting surface, by at least 100 μm or more.

Next, the electric circuits 3, 4, 7, and 15 will be described in further detail. The electric circuits 3, 4, 7, and 15 include coils 21, 23, 25, 27, and 29 corresponding to the above-described inductors.

The electric circuit 3 includes the coil 21. The coil 21 is disposed inside the element body 2. The coil 21 forms a coil axis AX1. The coil axis AX1 is along a direction orthogonal to the stacking direction. In this specification, "being orthogonal" includes a configuration with an offset within a manufacturing tolerance range. In the present embodiment, the coil axis AX1 is along the X-axis direction orthogonal to the Z-axis direction. When the Z-axis direction corresponds to first direction, the X-axis direction corresponds to a second direction.

The coil 21 defines a region R1 in which the coil axis AX1 is located when viewed in the X-axis direction. The region R1 is surrounded by the coil 21. The region R1 corresponds to a cross section of the coil 21 on a YZ-axis plane.

In the present embodiment, the coil 21 is a coil with a single winding. The coil 21 includes, for example, at least one conductor layer 31, a plurality of connection conductors 32, and an electrode 33. As illustrated in FIGS. 1 to 3 and FIG. 6, the coil 21 includes, for example, one conductor layer 31, two connection conductors 32, and one electrode 33.

The conductor layer 31 extends along the insulator layers 10. The conductor layer 31 is sandwiched between a pair of the insulator layers 10. The conductor layer 31 has, for example, a wire shape. The conductor layer 31 includes a pair of end portions 31a and 31b located opposite each other.

The conductor layer 31 includes, for example, an L-shaped portion 39. The L-shaped portion 39 has an L shape when viewed in the Z-axis direction. The conductor layer 31 includes a pair of extending portions 39a and 39b. The pair of extending portions 39a and 39b extend in directions intersecting each other when viewed in the Z-axis direction. The pair of extending portions 39a and 39b are connected to each other. The pair of extending portions 39a and 39b form the L-shaped portion 39.

Each of the plurality of connection conductors 32 is connected to the conductor layer 31. Each of the connection conductors 32 extends in the Z-axis direction. Each of the connection conductors 32 is formed of vias penetrating through the insulator layers 10. The plurality of connection conductors 32 include the connection conductor 32 connected to the end portion 31a, and the connection conductor 32 connected to the end portion 31b.

The electrode 33 is electrically connected to the conductor layer 31 and to the plurality of connection conductors 32. As illustrated in FIG. 3, the electrode 33 is disposed on the main surface 2a of the element body 2. The electrode 33 corresponds to the terminal electrode G1.

Next, the electric circuit 4 will be described in detail. The electric circuit 4 includes the coil 23. The coil 23 is disposed inside the element body 2. The coil 23 forms a coil axis AX3. The coil axis AX3 is along the stacking direction. In the present embodiment, the coil axis AX3 is along the Z-axis direction. When the coil 21 corresponds to a first coil, the coil 23 corresponds to a second coil.

The coil 23 is spaced apart from the coil 21. In this specification, when "being spaced apart" is used in relation to electric circuits, "being spaced apart" refers to a state where the electric circuits are not physically connected to each other by a conductor and a direct current component is not transmitted. The coil 23 is electrically connected to the coil 21. The coil 23 is connected to the coil 21 by AC coupling.

In the present embodiment, the coil 23 is a coil with a single winding. The coil 23 includes, for example, at least one conductor layer 34, a plurality of connection conductors 35, and an electrode 37. As illustrated in FIGS. 1 to 4 and FIG. 6, the coil 23 includes, for example, one conductor layer 34, two connection conductors 35, and one electrode 37.

The conductor layer 34 extends along the insulator layers 10. The conductor layer 34 is sandwiched between a pair of the insulator layers 10. The conductor layer 34 has, for example, a wire shape. The conductor layer 34 extends along the insulator layers 10 in a circumferential direction of the coil axis AX3 of the coil 23. The conductor layer 34 includes a pair of end portions 34a and 34b located opposite each other.

The conductor layer 34 includes an extending portion 36a extending along the end surface 2b of the element body 2, and an extending portion 36b extending along the side surface 2c of the element body 2. The extending portion 36a is closer to the end surface 2b than other portions of the conductor layer 34. The extending portion 36b is closer to the side surface 2c than other portions of the conductor layer 34. The extending portion 36a extends in the X-axis direction, and the extending portion 36b extends in the Y-axis direction.

The conductor layer 34 includes at least one curved portion 38. The curved portion 38 is curved to be spaced apart from the connection conductors 32 of the coil 21. In other words, the conductor layer 34 is curved to be spaced apart from the plurality of connection conductors 32. In the example illustrated in the present embodiment, a shortest distance between the conductor layer 34 and each of the connection conductors 32 is, for example, 100 μm. The conductor layer 34 includes, for example, two curved portions 38a and 38b. The curved portion 38a extends in a circumferential direction of the connection conductor 32 connected to the end portion 31a when viewed in the Z-axis direction. The curved portion 38b extends in a circumferential direction of the connection conductor 32 connected to the end portion 31b when viewed in the Z-axis direction. The curved portion 38b connects the extending portion 36a and the extending portion 36b.

Each of the plurality of connection conductors 35 is connected to the conductor layer 34. Each of the connection conductors 35 extends in the Z-axis direction. Each of the connection conductors 35 is formed of vias penetrating through the insulator layers 10. The plurality of connection conductors 35 include the connection conductor 35 connected to the end portion 34a, and the connection conductor 35 connected to the end portion 34b.

The electrode 37 is electrically connected to the conductor layer 34 and to the plurality of connection conductors 35. As illustrated in FIG. 3, the electrode 37 is disposed on the main surface 2a of the element body 2. The electrode 37 corresponds to the terminal electrode TE1.

When viewed in the X-axis direction, the conductor layer 34 of the coil 23 is located in the region R1 surrounded by the coil 21. When a width T1 of the region R1 in the Z-axis direction is 100, the conductor layer 34 of the coil 23 is located within a range T2 of ±30 in the Z-axis direction from the coil axis AX1 of the coil 21 in the region R1.

As illustrated in FIG. 6, the conductor layer 34 of the coil 23 overlaps the conductor layer 31 of the coil 21 when viewed in the Z-axis direction. In this specification, "overlapping" refers to a state where at least parts are located in the same region. The conductor layer 34 of the coil 23 overlaps at least the extending portion 39a of the conductor layer 31 when viewed in the Z-axis direction. For example, when viewed in the Z-axis direction, at least the entirety of the extending portion 36b of the conductor layer 34 is disposed in a region in which the extending portion 39a of the conductor layer 31 is located.

When viewed in the Z-axis direction, an edge of the extending portion 36b of the conductor layer 34 that is closest to the side surface 2c coincides with an edge of the extending portion 39a of the conductor layer 31 that is closest to the side surface 2c. In this specification, "coinciding" includes a configuration with an offset within a manufacturing tolerance range.

The conductor layer 34 of the coil 23 protrudes from the coil 21 to only one side in an extending direction of the coil axis AX1 when viewed in the Z-axis direction. For example, when viewed in the Z-axis direction, the conductor layer 34 of the coil 23 protrudes from the extending portion 39a of the coil 21 only in a +X-axis direction, and does not protrude from the extending portion 39a of the coil 21 in a −X-axis direction. In other words, when viewed in the Z-axis direction, the conductor layer 34 of the coil 23 is located in a region that is closer to a +X-axis direction side than the extending portion 39a of the coil 21, and is not located in a region that is closer to a −X-axis direction side than the extending portion 39a of the coil 21.

When viewed in the Z-axis direction, the conductor layer 34 of the coil 23 protrudes from the extending portion 39b of the coil 21 only in a −Y-axis direction, and does not protrude from the extending portion 39b of the coil 21 in a +Y-axis direction. In other words, when viewed in the Z-axis direction, the conductor layer 34 of the coil 23 is located in a region that is closer to a −Y-axis direction side than the extending portion 39b of the coil 21, and is not located in a region that is closer to a +Y-axis direction side than the extending portion 39b of the coil 21.

In the example illustrated in the present embodiment, a shortest distance between the conductor layer 31 of the coil 21 and the end surface 2b of the element body 2 and a shortest distance between the conductor layer 31 of the coil 21 and the side surface 2c of the element body 2 is, for example, 100 μm. In the example illustrated in the present embodiment, a shortest distance between the conductor layer 34 of the coil 23 and the end surface 2b of the element body 2 and a shortest distance between the conductor layer 34 of the coil 23 and the side surface 2c of the element body 2 is, for example, 100 μm. For example, the shortest distance between the conductor layer 31 of the coil 21 and the end surface 2b of the element body 2 and the shortest distance between the conductor layer 34 of the coil 23 and the side surface 2c of the element body 2 in the X-axis direction coincide with each other. In this case, an offset within a manufacturing tolerance range is, for example, ±25 μm.

Figure 7:
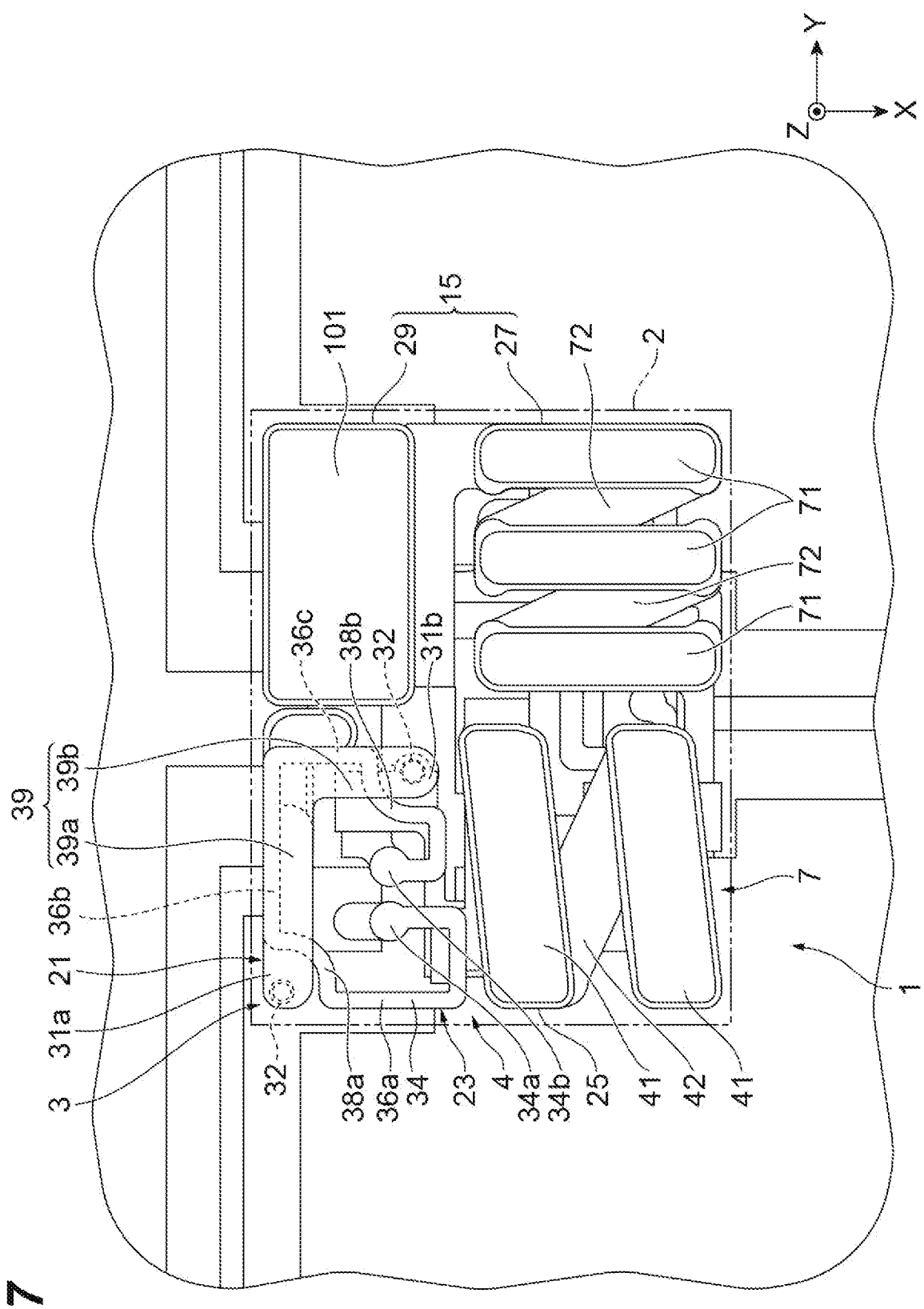
FIG. 7 is a plan view of an electronic component in a mounted state in a modification example of the present embodiment.

As a modification example of the present embodiment, as illustrated in FIG. 7, the conductor layer 34 of the coil 23 may overlap both the pair of extending portions 39a and 39b of the conductor layer 31 when viewed in the Z-axis direction. In the configuration illustrated in FIG. 7, the conductor layer 34 includes an extending portion 36c in addition to the extending portion 36a and the extending portion 36b. The extending portion 36c extends from the extending portion 36b in the X-axis direction. The extending portion 36c is closer to the coil 29 than other portions of the conductor layer 34.

In the configuration illustrated in FIG. 7, when viewed in the Z-axis direction, the entirety of the extending portion 36b of the conductor layer 34 is disposed in the region in which the extending portion 39a of the conductor layer 31 is located. When viewed in the Z-axis direction, the entirety of the extending portion 36b of the conductor layer 34 is located in a region in which the extending portion 39a and the extending portion 39b of the conductor layer 31 are located.

In the configuration illustrated in FIG. 7, an edge of the extending portion 36c of the conductor layer 34 that is closest to the coil 29 coincides with an edge of the extending portion 39b of the conductor layer 31 that is closest to the coil 29 when viewed in the Z-axis direction. For example, a shortest distance between the conductor layer 31 of the coil 21 and the coil 29 and a shortest distance between the conductor layer 34 of the coil 23 and the coil 29 in the Y-axis direction coincide with each other. In this case, an offset within a manufacturing tolerance range is, for example, ±25 μm.

Next, the electric circuit 7 will be described in detail. The electric circuit 7 includes the coil 25. The coil 25 is disposed inside the element body 2. The coil 25 forms a coil axis AX5. The coil axis AX5 is along a direction orthogonal to the Z-axis direction. In the present embodiment, the coil axis AX5 is along the X-axis direction. The coil 25 defines a region R2 in which the coil axis AX5 is located when viewed in the X-axis direction. The region R2 is surrounded by the coil 25. The region R2 corresponds to a cross section of the coil 23 on a YZ-axis plane. For example, the coil 25 corresponds to a third coil.

The coil 25 is spaced apart from the coils 21 and 23. The coil 25 is electrically connected to the coils 21 and 23. The coil 25 is connected to the coils 21 and 23 by AC coupling. The coil 21 and the coil 25 are disposed to generate mutual induction between the coil 21 and the coil 25.

As illustrated in FIG. 4, when viewed in the X-axis direction, the conductor layer 34 of the coil 23 is located in the region R2 surrounded by the coil 25. When a width T3 of the region R2 in the Z-axis direction is 100, the conductor layer 34 of the coil 23 is located within a range T5 of ±30 in the Z-axis direction from the coil axis AX5 of the coil 25 in the region R2.

In the present embodiment, the coil 25 is a coil with two windings. The coil 25 includes, for example, at least one conductor layer 41, at least one conductor layer 42, a plurality of connection conductors 43, and an electrode 45. In the electronic component 1, the coil 25 includes a plurality of the conductor layers 41. As illustrated in FIGS. 1, 2, 4, and 6, the coil 25 includes, for example, two conductor layers 41, one conductor layer 42, eight connection conductors 43, and one electrode 45. When the conductor layers 41 are first conductor layers, the conductor layer 42 corresponds to a second conductor layer.

In the present embodiment, the conductor layer 34 of the coil 23 is located between the coil 25 and the coil 21 when viewed in the Z-axis direction. In the configuration illustrated in FIG. 6, the conductor layer 34 of the coil 23 does not overlap the coil 25 when viewed in the Z-axis direction. When viewed in the Z-axis direction, the conductor layer 34 of the coil 23 is spaced apart from a region in which the conductor layers 41 of the coil 25 are located.

Figure 8:
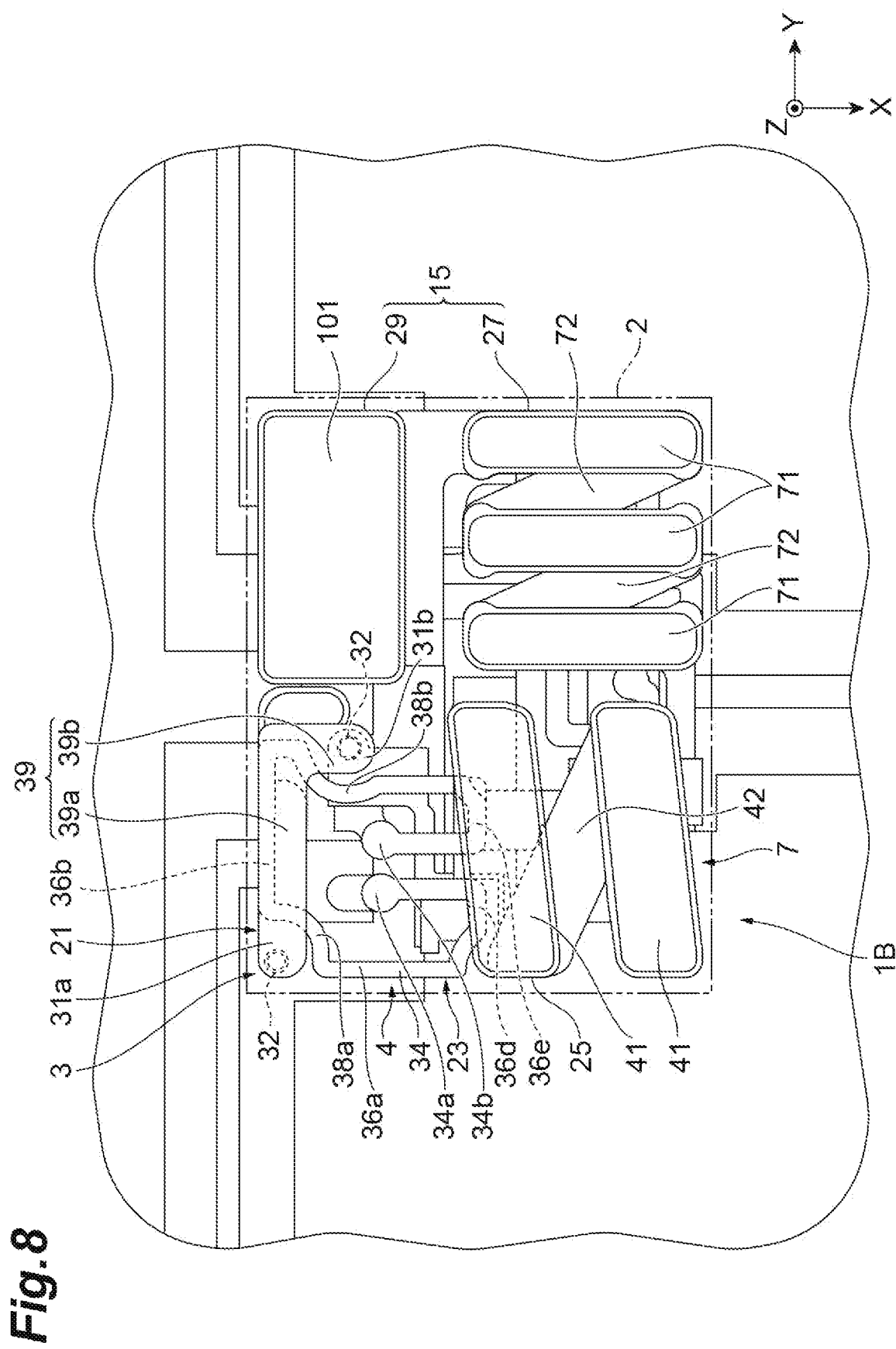
FIG. 8 is a plan view of an electronic component in a mounted state in another modification example of the present embodiment.

As a modification example of the present embodiment, as illustrated in FIG. 8, the conductor layer 34 of the coil 23 may overlap the conductor layers 41 of the coil 25 when viewed in the Z-axis direction. In the configuration illustrated in FIG. 8, the conductor layer 34 includes an expansion portion 36d and an expansion portion 36e in addition to the extending portion 36a and the extending portion 36b. The expansion portion 36d is located between the end portion 34a and the extending portion 36a in the conductor layer 34. The expansion portion 36e is located between the end portion 34b and the extending portion 36b in the conductor layer 34. When viewed in the Z-axis direction, the expansion portion 36d and the expansion portion 36e of the conductor layer 34 are located in the region in which the conductor layers 41 are located. As a further modification example of the present modification example, the conductor layer 34 may include only one of the expansion portion 36d and the expansion portion 36e. The conductor layer 34 may include at least one of the expansion portion 36d and the expansion portion 36e, and the extending portion 36c described with reference to FIG. 7.

In the present embodiment, the conductor layers 41 and the conductor layer 42 extend along the insulator layers 10. The conductor layers 41 and the conductor layer 42 are disposed at different positions in the Z-axis direction. The conductor layers 41 and the conductor layer 42 extend along directions that intersect the coil axis AX5 and that are along the insulator layers 10. For example, the direction along the insulator layers is a direction orthogonal to the Z-axis direction. Each of the conductor layers 41 and the conductor layer 42 is sandwiched between a pair of the insulator layers 10. Each of the conductor layers 41 and the conductor layer 42 has, for example, a wire shape. Each of the conductor layers 41 includes a pair of end portions 41a and 41b located opposite each other. The conductor layer 42 includes a pair of end portions 42a and 42b located opposite each other.

Figure 9A:
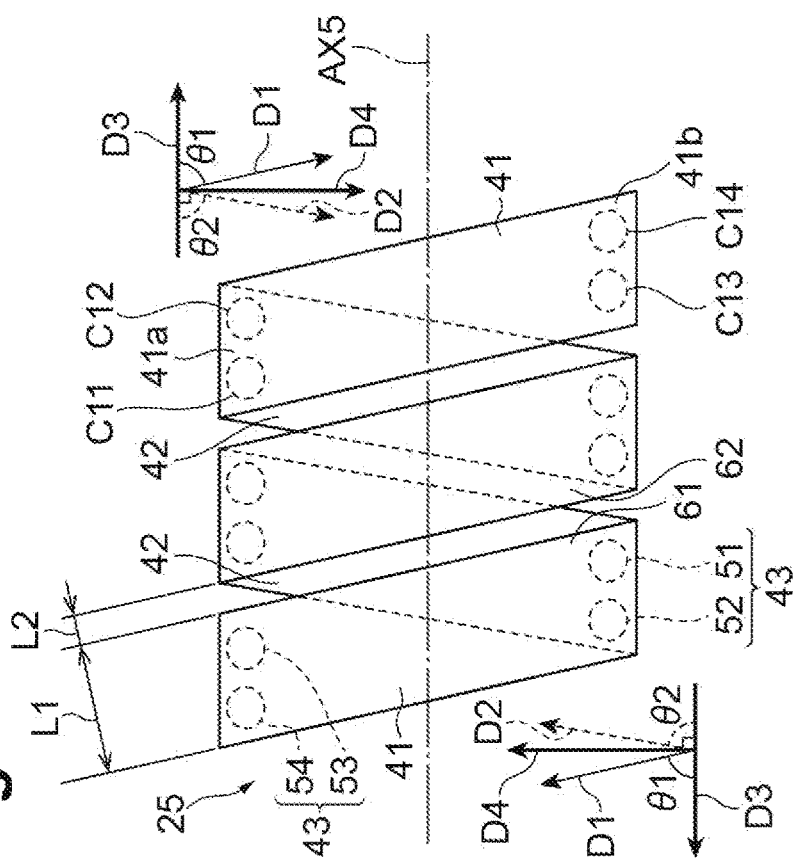
FIG. 9A is a schematic plan view of a coil in the electronic component in the present embodiment.

The plurality of conductor layers 41 are arranged along the coil axis AX5 and along the main surfaces 2a. The plurality of conductor layers 41 are arranged in the X-axis direction. FIG. 9A is a schematic plan view of the coil 25. As illustrated in FIG. 9A, an extending direction D1 of each of the conductor layers 41 is inclined to a direction D4 that is orthogonal to the coil axis AX5 and that is along the insulator layers 10. In this specification, "being inclined" does not include an orthogonal state. The extending direction D1 of each of the conductor layers 41 is also inclined to the coil axis AX5. When viewed in the Z-axis direction, each of the conductor layers 41 extends in a direction inclined to the X-axis direction and to the Y-axis direction. For example, the plurality of conductor layers 41 extend in the same direction.

The conductor layer 42 is connected to the corresponding conductor layer 41 among the plurality of conductor layers 41 through the connection conductor 43. As illustrated in FIG. 9A, an extending direction D2 of the conductor layer 42 is inclined to the direction D4 that is orthogonal to the coil axis AX5 and that is along the insulator layers 10. The extending direction D2 of the conductor layer 42 is also inclined to the coil axis AX5. When viewed in the Z-axis direction, the conductor layer 42 extends in a direction inclined to the X-axis direction and to the Y-axis direction. When viewed in the Z-axis direction, the extending direction D1 of each of the conductor layers 41 and the extending direction D2 of the conductor layer 42 intersect each other.

The plurality of connection conductors 43 are spaced apart from each other. Each of the plurality of connection conductors 43 is connected to at least one of the conductor layer 41 and the conductor layer 42. At least one connection conductor 43 connects the conductor layer 41 and the conductor layer 42 corresponding to each other. Each of the connection conductors 43 extends in the Z-axis direction. Each of the connection conductors 43 is formed of vias penetrating through the insulator layers 10.

The plurality of connection conductors 43 are each connected to the end portions 41a, 41b, 42a, and 42b of the conductor layers 41 and 42 corresponding to each other among the plurality of conductor layers 41 and 42. For example, a plurality of connection conductors 43 are connected to each of the pair of end portions 41a and 41b. For example, a plurality of connection conductors 43 are connected to each of the pair of end portions 42a and 42b.

The plurality of connection conductors 43 include connection conductors 51, 52, 53, and 54. The connection conductors 51 and 52 are connected to the same end portion 41a. The conductor layer 41 and the conductor layer 42 corresponding to each other among the plurality of conductor layers 41 and at least one conductor layer 42 are connected to each other through the connection conductor 51 and through the connection conductor 52. For example, each of the connection conductor 51 and the connection conductor 52 connects the end portion 41a of the conductor layer 41 and the end portion 42a or the end portion 42b of the conductor layer 42. The connection conductors 53 and 54 are connected to the same end portion 41b. The connection conductors 53 and 54 correspond to, for example, end portions of the coil 25. For example, the connection conductors 51, 52, 53, and 54 correspond to a first connection conductor, a second connection conductor, a third connection conductor, and a fourth connection conductor, respectively.

The connection conductors 51 and 52 and the connection conductors 53 and 54 are connected to, for example, the same conductor layer 41. The connection conductors 53 and 54 are connected to the end portion 41b of the conductor layer 41 connected to the connection conductors 51 and 52. For example, a length of each of the connection conductors 53 and 54 in the Z-axis direction is larger than a length of each of the connection conductors 51 and 52.

The plurality of conductor layers 41 include a pair of conductor layers 61 and 62 that are electrically connected to each other through the conductor layer 42 and through the plurality of connection conductors 51 and 52. The pair of conductor layers 61 and 62 are the conductor layers 41 adjacent to each other in a direction D3 along the coil axis AX5 among the plurality of conductor layers 41. The pair of conductor layers 61 and 62 extend in directions along each other when viewed in the Z-axis direction.

A shortest distance between the connection conductor 51 connected to the conductor layer 62 and the connection conductor 43 connected to the conductor layer 61 in the X-axis direction is smaller than a shortest distance between the connection conductor 52 connected to the conductor layer 62 and the connection conductor 43 connected to the conductor layer 61. A shortest distance between the connection conductor 51 and the connection conductor 53 in the X-axis direction is smaller than a shortest distance between the connection conductor 52 and the connection conductor 53 in the X-axis direction. A shortest distance between the connection conductor 53 connected to the conductor layer 62 and the connection conductor 43 connected to the conductor layer 61 is smaller than a shortest distance between the connection conductor 54 connected to the conductor layer 62 and the connection conductor 43 connected to the conductor layer 61. A shortest distance between the connection conductor 53 and the connection conductor 51 in the X-axis direction is smaller than a shortest distance between the connection conductor 54 and the connection conductor 51 in the X-axis direction.

In the conductor layers 41 adjacent to each other in the direction D3 along the coil axis AX5 among the plurality of conductor layers 41, a width L1 of each of the conductor layers 41 is larger than a shortest distance L2 between the conductor layers 41 adjacent to each other. The width L1 of the conductor layer 41 corresponds to a length of the conductor layer 41 in a direction that is orthogonal to the extending direction D1 and that is along the insulator layers 10. For example, the width L1 of each of the conductor layers 61 and 62 adjacent to each other in the direction orthogonal to the extending direction D1 is larger than the shortest distance L2 between the conductor layer 61 and the conductor layer 62 in the direction D3 along the coil axis AX5. The shortest distance L2 is, for example, a distance at which a stray capacitance generated between the conductor layer 61 and the conductor layer 62 adjacent to each other has a value allowable in consideration of an overall configuration of the electronic component 1. The shortest distance L2 is, for example, a distance set in consideration of manufacturing errors, at which connection between the conductor layer 61 and the conductor layer 62 can be suppressed in a manufacturing process. The shortest distance L2 is, for example, 20 μm or more. In the example illustrated in the present embodiment, the shortest distance L2 is 60 μm.

The connection conductor 51 and the end portion 41a of the conductor layer 41 are connected to each other at a connection portion C11. The connection conductor 52 and the end portion 41a of the conductor layer 41 are connected to each other at a connection portion C12. For example, in the X-axis direction along the coil axis AX5, the connection portion C11 is closer to the end portion 42b of the conductor layer 42 than the connection portion C12 adjacent to the connection portion C11. When viewed in the Z-axis direction, a shortest distance between the connection portion C11 of the conductor layer 61 and the conductor layer 62 is smaller than a shortest distance between the connection portion C12 of the conductor layer 61 and the conductor layer 62. A shortest distance between the connection portion C11 and a connection portion C13 in the X-axis direction is smaller than a shortest distance between the connection portion C12 and the connection portion C13 in the X-axis direction.

For example, in the conductor layer 41, the connection portion C11 and the connection portion C12 are arranged in the direction D3 inclined to the extending direction D1 of the conductor layer 41. In other words, an arrangement direction of the connection portion C11 and the connection portion C12 and the extending direction D1 of the conductor layer 41 are inclined to each other. Further, the arrangement direction of the connection portion C11 and the connection portion C12 and the extending direction D2 of the conductor layer 42 are inclined to each other. For example, the connection portion C11 and the connection portion C12 are arranged in the X-axis direction.

The connection conductor 53 and the end portion 41b of the conductor layer 41 are connected to each other at the connection portion C13. The connection conductor 54 and the end portion 41b of the conductor layer 41 are connected to each other at a connection portion C14. For example, in the X-axis direction along the coil axis AX5, the connection portion C13 is closer to the end portion 42b of the conductor layer 42 than the connection portion C14 adjacent to the connection portion C13. When viewed in the Z-axis direction, a shortest distance between the connection portion C13 of the conductor layer 62 and the conductor layer 61 is smaller than a shortest distance between the connection portion C14 of the conductor layer 62 and the conductor layer 61. The shortest distance between the connection portion C13 and a connection portion C11 in the X-axis direction is smaller than a shortest distance between the connection portion C14 and the connection portion C11 in the X-axis direction.

For example, in the conductor layer 41, the connection portion C13 and the connection portion C14 are arranged in the direction D3 inclined to the extending direction D1 of the conductor layer 41. In other words, an arrangement direction of the connection portion C13 and the connection portion C14 and the extending direction D1 of the conductor layer 41 are inclined to each other. For example, the connection portion C13 and the connection portion C14 are arranged in the X-axis direction. For example, the arrangement direction of the connection portion C11 and the connection portion C12 and the arrangement direction of the connection portion C13 and the connection portion C14 are parallel to each other. In this specification, "being parallel" includes a configuration with an offset within a manufacturing tolerance range.

In the conductor layer 41, the extending direction D1 of the conductor layer 41 and the arrangement direction of the connection portions C11 and C12 intersect each other at a formed angle θ1. The extending direction D2 of the conductor layer 42 connected to the connection conductors 51 and 52, and the arrangement direction of the connection portions C11 and C12 intersect each other at a formed angle θ2.

Figure 9B:
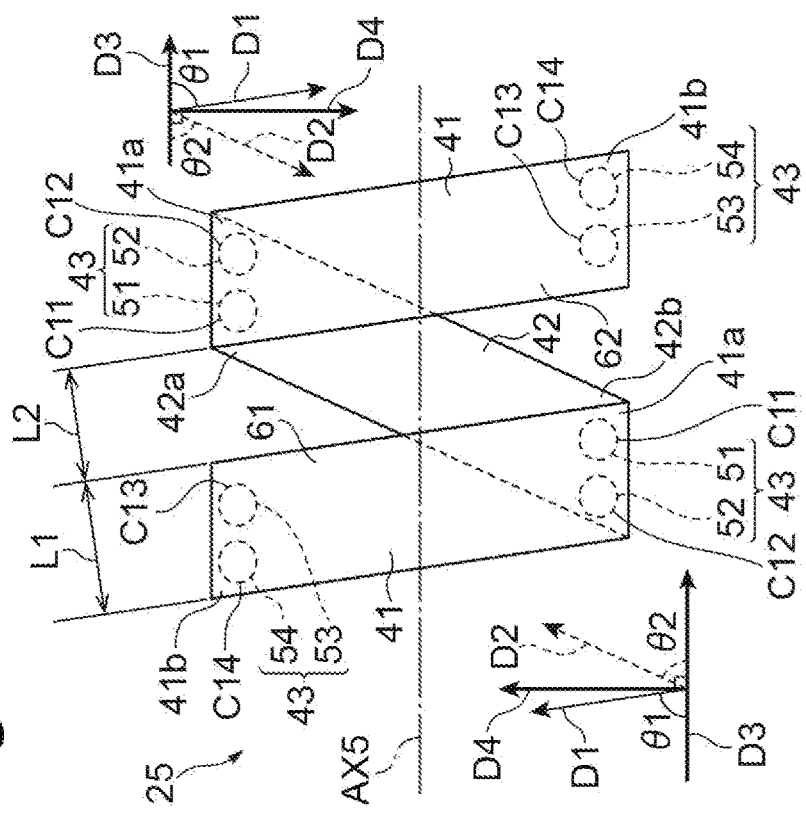
FIG. 9B is a schematic plan view of a coil in an electronic component in a modification example of the present embodiment.

As illustrated in FIG. 9A, the formed angle θ1 and the formed angle θ2 are different from each other. As a modification example of the present embodiment, as illustrated in FIG. 9B, the formed angle θ1 and the formed angle θ2 may be equal to each other. In this specification, "being equal" includes a configuration with an offset within a manufacturing tolerance range. FIG. 9B is a schematic plan view of the coil 25 in a modification example of the present embodiment.

As a modification example of the present embodiment, as illustrated in FIG. 9B, the conductor layer 41 and the conductor layer 42 connected to each other through the connection conductors 51 and 52 may be line-symmetrically disposed when viewed in the Z-axis direction. The coil 25 may be a coil with three or more windings. In the present modification example, the coil 25 is a coil with three windings.

The electrode 45 is electrically connected to the plurality of conductor layers 41 and 42 and to the plurality of connection conductors 43. As illustrated in FIG. 4, the electrode 45 is disposed on the main surface 2a of the element body 2. The electrode 45 corresponds to the terminal electrode G2.

Next, the electric circuit 15 will be described in detail. The electric circuit 15 includes the coil 27 and the coil 29. The coil 27 and the coil 29 are disposed inside the element body 2. When viewed in the Z-axis direction, the coil 27 is adjacent to the coil 25 and to the coil 29 among the coils 21, 25, and 29. When viewed in the Z-axis direction, the coil 29 is adjacent to the coil 21 and to the coil 27 among the coils 21, 25, and 27.

The coil 27 and the coil 29 form coil axes AX7 and AX9 along directions orthogonal to the stacking direction, respectively. When viewed in the Z-axis direction, the coil axis AX5 of the coil 25 and the coil axis AX7 of the coil 27 intersect each other. When viewed in the Z-axis direction, the coil axis AX7 of the coil 27 and the coil axis AX9 of the coil 29 intersect each other. For example, the coil axis AX7 of the coil 27 is along the Y-axis direction. For example, the coil axis AX9 of the coil 29 is along the X-axis direction.

The coil 27 is spaced apart from the coils 21, 23, and 25. The coil 27 is electrically connected to the coils 21, 23, and 25. The coil 27 is connected to the coils 21, 23, and 25 by AC coupling. In the present embodiment, the coil 27 is a coil with three windings. The coil 27 includes, for example, at least one conductor layer 71, at least one conductor layer 72, a plurality of connection conductors 73, and an electrode. In the electronic component 1, the coil 27 includes a plurality of the conductor layers 71 and a plurality of the conductor layers 72. As illustrated in FIGS. 1, 2, and 6, the coil 27 includes, for example, three conductor layers 71, two conductor layers 72, 12 connection conductors 73, and one electrode. The electrode is electrically connected to the plurality of conductor layers 71 and 72 and to the plurality of connection conductors 73, and is disposed on the main surface 2a of the element body 2. The electrode corresponds to the terminal electrode G3.

The coil 29 is spaced apart from the coils 21, 23, and 25. The coil 29 is electrically connected to the coils 21, 23, and 25. The coil 29 is connected to the coils 21, 23, and 25 by AC coupling. In the present embodiment, the coil 29 is a coil with a single winding. The coil 29 includes, for example, at least one conductor layer 101, a plurality of connection conductors 103, and an electrode. The electrode is electrically connected to the conductor layer 101 and to the plurality of connection conductors 103, and is disposed on the main surface 2a of the element body 2. The electrode corresponds to the terminal electrode TE3.

In the coil 27, the conductor layers 71 and the conductor layers 72 extend along the insulator layers 10. The conductor layers 71 and the conductor layers 72 are disposed at different positions in the Z-axis direction. The conductor layers 71 and the conductor layers 72 extend along directions that intersect the coil axis AX7 and that are along the insulator layers 10. Each of the conductor layers 71 and the conductor layers 72 is sandwiched between a pair of the insulator layers 10. Each of the conductor layers 71 and the conductor layers 72 has, for example, a wire shape. Each of the conductor layers 71 includes a pair of end portions 71a and 71b located opposite each other. Each of the conductor layers 72 includes a pair of end portions 72a and 72b located opposite each other.

The plurality of conductor layers 71 are arranged along the coil axis AX7 and along the main surfaces 2a. The plurality of conductor layers 71 are arranged in the Y-axis direction. FIG. 10A is a schematic plan view of the coil 27. As illustrated in FIG. 10A, when viewed in the Z-axis direction, an extending direction D11 of each of the conductor layers 71 is along a direction orthogonal to the coil axis AX7. In other words, each of the conductor layers 71 is along the X-axis direction.

The plurality of conductor layers 72 are arranged along the coil axis AX7 and along the main surfaces 2a. The plurality of conductor layers 72 are arranged in the Y-axis direction. As illustrated in FIG. 10A, each of the conductor layers 72 extends in a direction that is inclined to the extending direction D11 of the conductor layers 71 and that is along the insulator layers. When viewed in the Z-axis direction, the extending direction D11 of each of the conductor layers 71 and an extending direction D12 of each of the conductor layers 72 intersect each other. When viewed in the Z-axis direction, each of the conductor layers 72 extends in a direction inclined to the X-axis direction and to the Y-axis direction. The extending direction D12 of each of the conductor layers 72 is inclined to the direction D11 that is orthogonal to the coil axis AX7 and that is along the insulator layers 10. For example, the plurality of conductor layers 72 extend in the same direction.

The plurality of connection conductors 73 are spaced apart from each other. Each of the plurality of connection conductors 73 is connected to at least one of the conductor layers 71 and the conductor layers 72. At least one connection conductor 73 connects the conductor layer 71 and the conductor layer 72 corresponding to each other. Each of the connection conductors 73 extends in the Z-axis direction. Each of the connection conductors 73 is formed of vias penetrating through the insulator layers 10.

The plurality of connection conductors 73 are each connected to the end portions 71a, 71b, 72a, and 72b of the conductor layers 71 and 72 corresponding to each other among the plurality of conductor layers 71 and 72. For example, a plurality of connection conductors 73 are connected to each of the pair of end portions 71a and 71b. For example, a plurality of connection conductors 73 are connected to each of the pair of end portions 72a and 72b.

The plurality of connection conductors 73 include connection conductors 81, 82, 83, 84, 85, and 86. The connection conductors 81 and 82 are connected to the same end portion 71a. The conductor layer 71 and the conductor layer 72 corresponding to each other among the plurality of conductor layers 71 and the plurality of conductor layers 72 are connected to each other through the connection conductor 81 and through the connection conductor 82. For example, each of the connection conductor 81 and the connection conductor 82 connects the end portion 71a of the conductor layer 71 and the end portion 72a of the conductor layer 72. For example, a length of each of the connection conductors 83 and 84 in the Z-axis direction is larger than a length of each of the connection conductors 81, 82, 85, and 86. For example, the length of each of the connection conductors 81 and 82 in the Z-axis direction is equal to the length of each of the connection conductors 85 and 86.

The connection conductors 83 and 84 are connected to the conductor layer 71 connected to the connection conductors 81 and 82. The connection conductors 83 and 84 are connected to the same end portion 71b. The connection conductors 83 and 84 correspond to, for example, end portions of the coil 27.

The connection conductors 85 and 86 are connected to each of the same end portions 71a and 71b. The conductor layer 71 and the conductor layer 72 corresponding to each other among the plurality of conductor layers 71 and the plurality of conductor layers 72 are connected to each other through the connection conductor 85 and through the connection conductor 86. For example, each of the connection conductor 85 and the connection conductor 86 connects the end portion 71a or the end portion 71b of the conductor layer 71 and the end portion 72b of the conductor layer 72.

The connection conductors 81 and 82 and the connection conductors 83 and 84 are connected to, for example, the same conductor layer 71. The connection conductors 83 and 84 are connected to the end portion 71b of the conductor layer 71 connected to the connection conductors 81 and 82. The connection conductors 81 and 82 and the connection conductors 85 and 86 are connected to, for example, the same conductor layer 72. The connection conductors 85 and 86 are connected to the end portion 72b of the conductor layer 72 connected to the connection conductors 81 and 82.

The plurality of conductor layers 71 includes a pair of conductor layers 91 and 92 that are electrically connected to each other through at least one conductor layer 72, through the connection conductors 81 and 82, and through the connection conductors 85 and 86. The pair of conductor layers 91 and 92 are the conductor layers 71 that are the most apart from each other in a direction D13 along the coil axis AX7 among the plurality of conductor layers 71. The pair of conductor layers 91 and 92 are the conductor layers 71 located at both ends in the Y-axis direction among the plurality of conductor layers 71. The conductor layer 91 is the conductor layer 71 that is closest to the end surface 2b among the plurality of conductor layers 71. The conductor layer 91 is the conductor layer 71 that is farthest from the electric circuit 7 among the plurality of conductor layers 71. The conductor layer 92 is the conductor layer 71 that is farthest from the end surface 2b among the plurality of conductor layers 71. The conductor layer 92 is the conductor layer 71 that is closest to the electric circuit 7 among the plurality of conductor layers 71. Other conductor layers 71 are located between the conductor layer 91 and the conductor layer 92 in the Y-axis direction. The pair of conductor layers 91 and 92 extend in directions along each other when viewed in the Z-axis direction.

A shortest distance between the connection conductor 81 connected to the conductor layer 91 and the connection conductor 73 connected to the conductor layer 92 in the Y-axis direction is smaller than a shortest distance between the connection conductor 82 connected to the conductor layer 91 and the connection conductor 73 connected to the conductor layer 92. A shortest distance between the connection conductor 81 and the connection conductor 83 in the Y-axis direction is smaller than a shortest distance between the connection conductor 82 and the connection conductor 83 in the Y-axis direction. A shortest distance between the connection conductor 83 connected to the conductor layer 91 and the connection conductor 73 connected to the conductor layer 92 in the Y-axis direction is smaller than a shortest distance between the connection conductor 84 connected to the conductor layer 91 and the connection conductor 73 connected to the conductor layer 92. The shortest distance between the connection conductor 83 and the connection conductor 81 in the Y-axis direction is smaller than a shortest distance between the connection conductor 84 and the connection conductor 81 in the Y-axis direction.

The connection conductors 81 and 82 are connected to, for example, the respective end portions 71a of the pair of conductor layers 91 and 92. The connection conductors 83 and 84 are connected to, for example, the respective end portions 71b of the pair of conductor layers 91 and 92. A connection portion C21 and a connection portion C22 in the conductor layer 91 are arranged in a direction D14 along an arrangement direction of the connection portion C21 and the connection portion C22 in the conductor layer 92. For example, an arrangement direction of the connection portion C21 and the connection portion C22 in the conductor layer 91 and the arrangement direction of the connection portion C21 and the connection portion C22 in the conductor layer 92 are parallel to each other. The arrangement direction of the connection portion C21 and the connection portion C22 in the conductor layer 91 and an arrangement direction of a connection portion C23 and a connection portion C24 in the conductor layer 91 intersect each other.

The connection portion C23 and the connection portion C24 in the conductor layer 91 are arranged in a direction D15 along an arrangement direction of the connection portion C23 and the connection portion C24 in the conductor layer 92. For example, the arrangement direction of the connection portion C23 and the connection portion C24 in the conductor layer 91 and the arrangement direction of the connection portion C23 and the connection portion C24 in the conductor layer 92 are parallel to each other. In this case, when viewed in the Z-axis direction, a rugby ball-shaped region is defined by lines connecting the connection portions C21, C22, C23, C24, C25, and C26 of the plurality of conductor layers 71.

The connection conductor 81 and the end portion 71a of the conductor layer 71 are connected to each other at the connection portion C21. The connection conductor 82 and the end portion 71a of the conductor layer 71 are connected to each other at the connection portion C22. For example, in the Y-axis direction along the coil axis AX7, the connection portion C21 is closer to the end portion 72b of the conductor layer 72 than the connection portion C22 adjacent to the connection portion C21. When viewed in the Z-axis direction, a shortest distance between the connection portion C21 of the conductor layer 91 and the conductor layer 92 is smaller than a shortest distance between the connection portion C22 of the conductor layer 91 and the conductor layer 92. A shortest distance between the connection portion C21 and the connection portion C25 in the Y-axis direction is smaller than a shortest distance between the connection portion C22 and the connection portion C25 in the Y-axis direction.

For example, in the conductor layer 71, the connection portion C21 and the connection portion C22 are arranged in the direction D14 inclined to the extending direction D11 of the conductor layer 71. In other words, the arrangement direction of the connection portion C21 and the connection portion C22 and the extending direction D11 of the conductor layer 71 are inclined to each other. An angle θ7 formed by the arrangement direction of the connection portion C21 and the connection portion C22 and the extending direction D11 of the conductor layer 71 connected to the connection conductors 81 and 82 is, for example, 80 degrees or less.

Further, the arrangement direction of the connection portion C21 and the connection portion C22 and the extending direction D12 of the conductor layer 72 intersect each other. For example, the arrangement direction of the connection portion C21 and the connection portion C22 and the extending direction D12 of the conductor layer 72 are orthogonal to each other. In the conductor layer 71, the connection portion C22 is closer to the end portion 71b of the conductor layer 71 than the connection portion C21 adjacent to the connection portion C22. In other words, in the extending direction D11 of the conductor layer 71, the connection portion C21 is further apart from the end portion 71b than the connection portion C22.

The connection conductor 83 and the end portion 71b of the conductor layer 71 are connected to each other at the connection portion C23. The connection conductor 84 and the end portion 71b of the conductor layer 71 are connected to each other at the connection portion C24. For example, in the Y-axis direction along the coil axis AX7, the connection portion C23 is closer to the end portion 72b of the conductor layer 72 than the connection portion C24 adjacent to the connection portion C23. When viewed in the Z-axis direction, a shortest distance between the connection portion C23 of the conductor layer 91 and the conductor layer 92 is smaller than a shortest distance between the connection portion C24 of the conductor layer 91 and the conductor layer 92. A shortest distance between the connection portion C23 and the connection portion C25 in the Y-axis direction is smaller than a shortest distance between the connection portion C24 and the connection portion C25 in the Y-axis direction.

For example, in the conductor layer 71, the connection portion C23 and the connection portion C24 are arranged in the direction D15 inclined to the extending direction D11 of the conductor layer 71. In other words, the arrangement direction of the connection portion C23 and the connection portion C24 and the extending direction D11 of the conductor layer 71 are inclined to each other. An angle θ8 formed by the arrangement direction of the connection portion C23 and the connection portion C24 and the extending direction D11 of the conductor layer 71 connected to the connection conductors 81 and 82 is, for example, 80 degrees or less.

The arrangement direction of the connection portion C21 and the connection portion C22 and the arrangement direction of the connection portion C23 and the connection portion C24 intersect each other. A position at which the arrangement direction of the connection portion C21 and the connection portion C22 and the arrangement direction of the connection portion C23 and the connection portion C24 intersect each other is located between the connection portion C21 and the connection portion C23 in the conductor layer 71 when viewed in a direction along the coil axis AX7. A position at which the arrangement direction of the connection portion C21 and the connection portion C22 in the conductor layer 92 and the arrangement direction of the connection portion C23 and the connection portion C24 intersect each other is located opposite the conductor layer 91. In the conductor layer 71, the connection portion C24 is closer to the end portion 71a of the conductor layer 71 than the connection portion C23. In other words, in the extending direction D11 of the conductor layer 71, the connection portion C23 is further apart from the end portion 71a than the connection portion C24 adjacent to the connection portion C23.

The connection conductor 85 and the end portion 71b of the conductor layer 71 are connected to each other at the connection portion C25. The connection conductor 86 and the end portion 71b of the conductor layer 71 are connected to each other at the connection portion C26. When viewed in the Z-axis direction, a shortest distance between the connection portion C25 of the conductor layer 91 and the conductor layer 92 is smaller than a shortest distance between the connection portion C26 of the conductor layer 91 and the conductor layer 92. The shortest distance between the connection portion C25 and the connection portion C21 in the Y-axis direction is smaller than a shortest distance between the connection portion C26 and the connection portion C21 in the Y-axis direction. For example, in the conductor layer 72, the connection portion C25 and the connection portion C26 are arranged in the direction D13 inclined to the extending direction D12 of the conductor layer 72. The connection portion C25 and the connection portion C26 are arranged, for example, in the Y-axis direction. In other words, an arrangement direction of the connection portion C25 and the connection portion C26 and the extending direction D12 of the conductor layer 72 are inclined to each other. For example, the arrangement direction of the connection portion C25 and the connection portion C26 and the extending direction D11 of the conductor layer 71 are orthogonal to each other. The arrangement direction of the connection portion C25 and the connection portion C26 and the arrangement direction of the connection portion C21 and the connection portion C22 intersect each other. The arrangement direction of the connection portion C25 and the connection portion C26 and the arrangement direction of the connection portion C23 and the connection portion C24 intersect each other.

As a modification example of the present embodiment, as illustrated in FIG. 10B, the arrangement direction of the connection portion C21 and the connection portion C22 in the conductor layer 91 and the arrangement direction of a connection portion C21 and a connection portion C22 in the conductor layer 92 may intersect each other. The arrangement direction of the connection portion C23 and the connection portion C24 in the conductor layer 91 and the arrangement direction of the connection portion C23 and a connection portion C24 in the conductor layer 92 may intersect each other. For example, in the configuration illustrated in FIG. 10B, the arrangement direction of the connection portion C21 and the connection portion C22 in the conductor layer 92 and the arrangement direction of the connection portion C23 and the connection portion C24 in the conductor layer 92 may extend along the Y-axis direction.

Figure 11A:
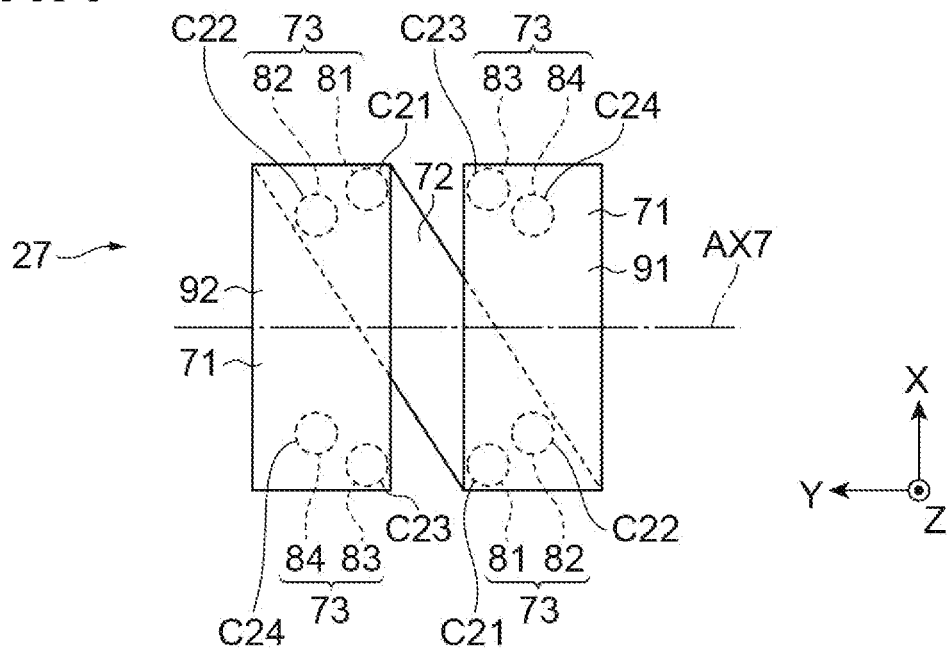
FIGS. 11A and 11B are schematic plan views of coils in electronic components in modification examples of the present embodiment.
Figure 11B:
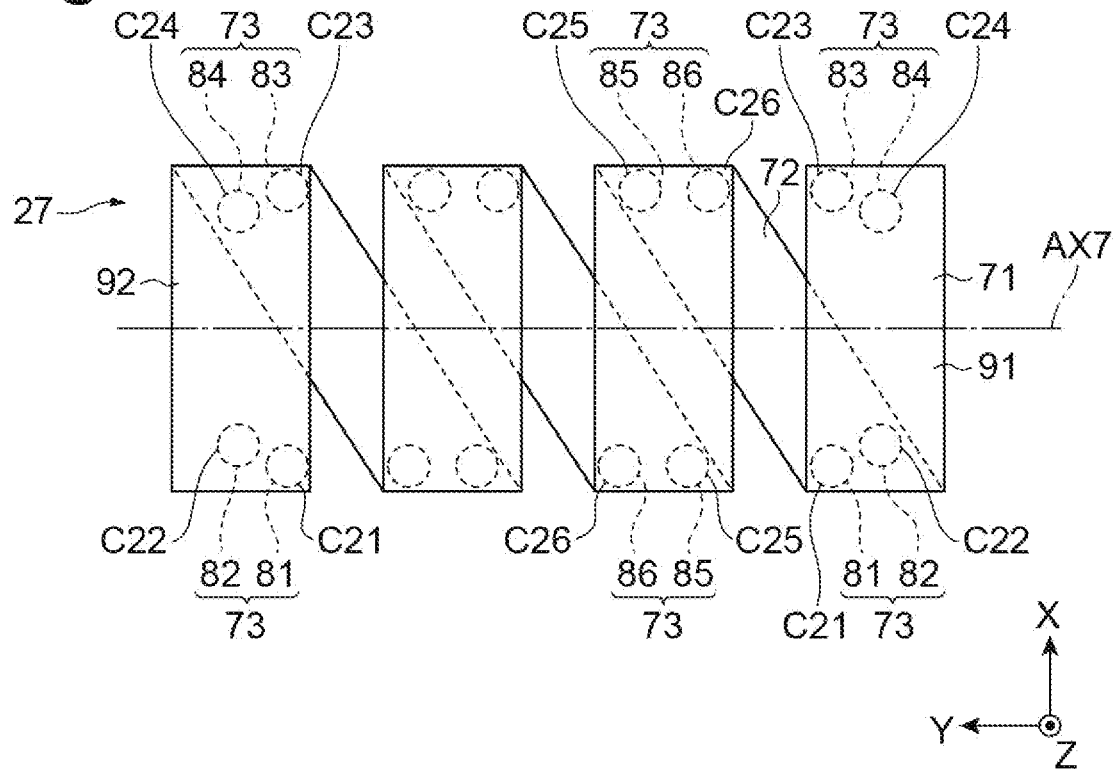

As further another modification example of the present embodiment, as illustrated in FIG. 11A, the coil 27 may be a coil with two windings. In this case, the coil 27 does not include the conductor layers 71 other than the conductor layers 91 and 92. The coil 27 does not include the connection conductors 85 and 86. The conductor layer 91 and the conductor layer 92 are adjacent to each other in the Y-axis direction. As further another modification example of the present embodiment, as illustrated in FIG. 11B, the coil 27 may be a coil with three or more windings. In this case, the coil 27 includes a plurality of the conductor layers 71 disposed between the conductor layer 91 and the conductor layer 92 in the Y-axis direction.

As further another modification example of the present embodiment, as illustrated in FIGS. 12A and 12B, the coil 27 may be a coil with a single winding. As illustrated in FIG. 12B, in the conductor layer 71, the connection portion C22 may be closer to the end portion 71b of the conductor layer 71 than the connection portion C21, and the connection portion C23 may be closer to the end portion 71a of the conductor layer 71 than the connection portion C24. In other words, in the extending direction D11 of the conductor layer 71, the connection portion C21 may be further apart from the end portion 71b than the connection portion C22, and the connection portion C23 may be closer to the end portion 71a than the connection portion C24.

The disposition of a connection portion C23 and a connection portion C24 illustrated in FIG. 12B may be applied to the above-described configurations of FIGS. 10A, 10B, 11A, and 11B. In the configuration illustrated in FIG. 12B, for example, in the conductor layer 71, a shortest distance between the connection portion C21 and the connection portion C23 is equal to a shortest distance between the connection portion C22 and the connection portion C24. In the configuration illustrated in FIG. 12B, the connection portion C21 and the connection portion C22 are arranged in a direction along an arrangement direction of the connection portion C23 and the connection portion C24. For example, an arrangement direction of the connection portion C21 and the connection portion C22 and the arrangement direction of the connection portion C23 and the connection portion C24 are parallel to each other.

Strictly speaking, the example illustrated in FIG. 12B also includes a configuration in which the arrangement direction of the connection portion C21 and the connection portion C22 and the arrangement direction of the connection portion C23 and the connection portion C24 intersect each other. In this configuration, a position at which the arrangement direction of the connection portion C21 and the connection portion C22 and the arrangement direction of the connection portion C23 and the connection portion C24 intersect each other is located in an outside region interposed between the connection portion C21 and the connection portion C23 in the conductor layer 71 when viewed in the direction along the coil axis AX7. In this configuration, the position at which the arrangement direction of the connection portion C21 and the connection portion C22 and the arrangement direction of the connection portion C23 and the connection portion C24 intersect each other is further apart from the connection portion C23 than from the connection portion C21 in the conductor layer 71 when viewed in the direction along the coil axis AX7.

Next, actions and effects of the electronic component 1 in the present embodiment and the modification examples will be described. In the electronic component 1, when viewed in the X-axis direction, the coil 23 is located in the region R1 surrounded by the coil 21. When viewed in the stacking direction, the coil 23 overlaps the coil 21, and protrudes from the coil 21 to only one side. In this case, a magnetic field generated in the coil 23 is unlikely to affect the coil 21 while a space required to dispose the coil 21 and the coil 23 is reduced. For this reason, it is possible to achieve both the compactness of and the realization of desired characteristics of the electronic component 1.

The coil 21 includes the conductor layer 31 and the connection conductors 32. The conductor layer 31 extends along the insulator layers 10. The connection conductors 32 are connected to the conductor layer 31, and extend in the stacking direction. For this reason, the coil 21 having an improved Q value can be easily configured.

The coil 23 is curved to be spaced apart from the connection conductors 32. For this reason, a distance between the coil 21 and the coil 23 is ensured. As a result, stray capacitance between the coil 21 and the coil 23 can be reduced. Further, connection between the coil 21 and the coil 23 can be suppressed in a manufacturing process. For this reason, according to the structure of the electronic component 1, production throughput can also be suppressed.

The coil 23 includes the curved portion 38. The curved portion 38 extends in the circumferential direction of the connection conductor 32 when viewed in the stacking direction. Hereinafter, a "cross-sectional area of a coil" means an area of a region surrounded by the coil when viewed in a direction along a coil axis, when the coil is cut along a plane orthogonal to the coil axis. For example, in the coil 21, an area of the region R1 corresponds to a cross-sectional area of the coil 21. In this configuration, a relatively large cross-sectional area of the coil 23 can be ensured. The distance between the coil 21 and the coil 23 can also be ensured while inductance of the coil 23 is improved.

The conductor layer 31 includes the pair of extending portions 39a and 39b. When viewed in the stacking direction, the pair of extending portions 39a and 39b extend in the directions intersecting each other, and are connected to each other. In this case, a relatively large cross-sectional area of the coil 21 can be ensured. A large length of the conductor layer 31 of the coil 21 compared to a size of a space in which the coil 21 is disposed can be ensured. In this configuration, inductance of the coil 21 can be improved.

In the modification example illustrated in FIG. 7, the coil 23 overlaps both the pair of extending portions 39a and 39b when viewed in the stacking direction. In this case, a relatively large cross-sectional area of the coil 23 can be ensured. A large length of the conductor layer 34 of the coil 23 compared to a size of a space in which the coil 23 is disposed can be ensured. In this configuration, inductance of the coil 23 can be further improved.

The conductor layer 34 of the coil 23 extends along the insulator layers 10 in the circumferential direction of the coil axis AX3 of the coil 23. When the width T1 of the region R1 in the stacking direction is 100, the conductor layer 34 of the coil 23 is located within the range T2 of ±30 in the stacking direction from the coil axis AX1 of the coil 21 in the region R1. In this case, it is possible to achieve both suppression of impedance and a reduction in stray capacitance. When the coil 23 deviates from the range T2, the stray capacitance increases, which is a problem. When the coil 23 is located closer to a mounting surface side than to the range T2, the coil 23 as a whole is located relatively close to the ground, so that impedance decreases, which is a problem.

The coil 21 and the coil 23 are connected to each other by AC coupling. In this case, desired characteristics are obtained in the electronic component 1 as a whole.

The coil 25 is disposed inside the element body 2 so as to be spaced apart from the coil 21. The coil 25 forms the coil axis AX5 along the X-axis direction. When viewed in the X-axis direction, the coil 23 is located in the region R2 surrounded by the coil 25. In the modification example illustrated in FIG. 8, the coil 23 overlaps the coil 25 when viewed in the stacking direction. In this case, a magnetic field generated in the coil 23 is also unlikely to affect the coil 25. Further, a relatively large cross-sectional area of the coil 23 can be ensured. A larger length of the conductor layer 34 of the coil 23 can be ensured. Therefore, inductance of the coil 23 can be further improved. For this reason, it is possible to achieve both the compactness of and the realization of desired characteristics of the electronic component 1.

The coil 21 and the coil 25 are disposed to generate mutual induction between the coil 21 and the coil 25. In such a configuration, a space between the coil 21 and the coil 25 generating mutual induction is used for the disposition of the coil 23. As a result, it is possible to achieve both the compactness of and the realization of desired characteristics of the electronic component 1.

The larger a width of a conductor layer is, the smaller inductance is. However, when conductor layers are disposed in element bodies having the same size, as illustrated in FIGS. 13A and 13B, the larger a width of the conductor layers is, the more a shortest distance between the conductor layers adjacent to each other is reduced. FIGS. 13A and 13B illustrate comparative examples of schematic plan views of coils when viewed in a stacking direction. In FIGS. 13A and 13B, the stacking direction corresponds to the Z-axis direction.

In FIG. 13A, a pair of conductor layers 111 are connected to each other through a conductor layer 112. The pair of conductor layers 111 and the conductor layer 112 are located at different positions in the Z-axis direction. In FIG. 13B, a pair of conductor layers 121 are connected to each other through a conductor layer 122. The pair of conductor layers 121 and the conductor layer 122 are located at different positions in the Z-axis direction. The pair of conductor layers 111 and the pair of conductor layers 121 correspond to, for example, the conductor layers 41 in the electronic component 1. The conductor layer 112 and the conductor layer 122 correspond to, for example, the conductor layers 42 in the electronic component 1.

In the configuration illustrated in FIG. 13A and in the configuration illustrated in FIG. 13B, lengths L10 of regions in which the conductor layers are provided are equal in the Y-axis direction. A width L21 of the conductor layers 121 in FIG. 13B is larger than a width L11 of the conductor layers 111 in FIG. 13A. The width L21 of the conductor layers 121 corresponds to a length of the conductor layers 121 in the Y-axis direction. The width L11 of the conductor layers 111 corresponds to a length of the conductor layers 111 in the Y-axis direction. In this case, a shortest distance L22 between the pair of conductor layers 121 is smaller than a shortest distance L12 between the pair of conductor layers 111. In such a manner, the larger the width of the conductor layers is, the more a shortest distance between the conductor layers adjacent to each other is reduced. When the shortest distance L22 between the pair of conductor layers 121 is too small, a stray capacitance is generated between the pair of conductor layers 121.

In the electronic component 1, in the conductor layers 41 and 42 adjacent to each other in the direction along the coil axis AX5 among the plurality of conductor layers 41 and 42, the width L1 in the direction orthogonal to the extending directions D1 and D2 of each of the conductor layers 41 and 42 is larger than the shortest distance L2 of the conductor layers 41 adjacent to each other. The extending direction D1 of each of the conductor layers 41 and the extending direction D2 of at least one conductor layer 42 intersect each other when viewed in the Z-axis direction, and are inclined to the direction D4 that is orthogonal to the coil axis AX5 and that is along the insulator layers 10. According to this configuration, the conductor layers 41 and 42 are disposed to reduce a length of an electric current path in the coil 25 while ensuring a relatively large width of the conductor layers 41 and 42. The shorter the electric current path in the coil 25 is, the further inductance can be reduced. In such a manner, the electronic component 1 includes the conductor layers 41 and 42 configured to reduce inductance in the coil 25. As a result, it is possible to achieve both the compactness of and the realization of desired characteristics of the electronic component.

Figure 14A:
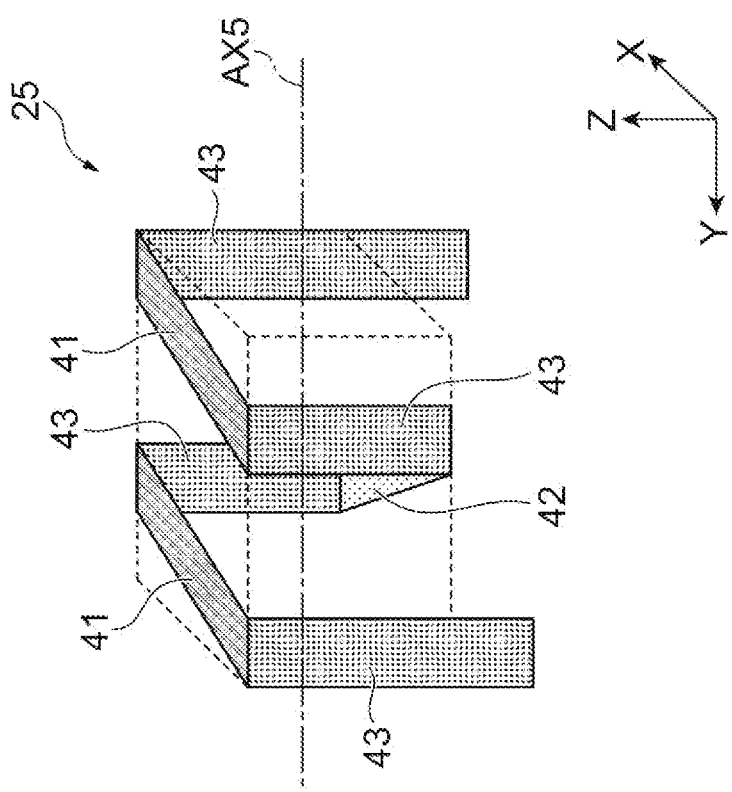
FIG. 14A is a schematic perspective view of a coil in a comparative example.
Figure 14B:
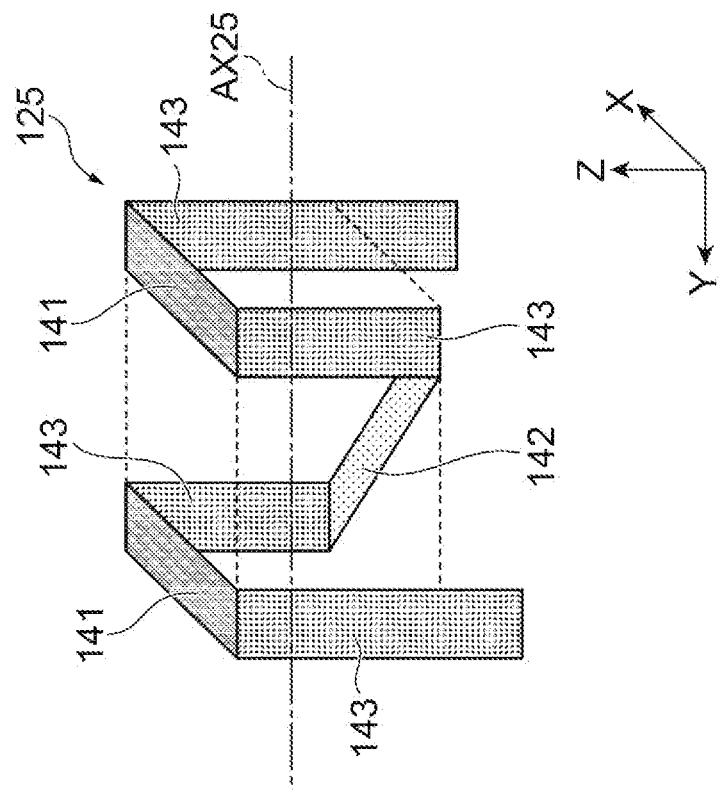
FIG. 14B is a schematic perspective view of the coil in the electronic component.
Figure 15A:
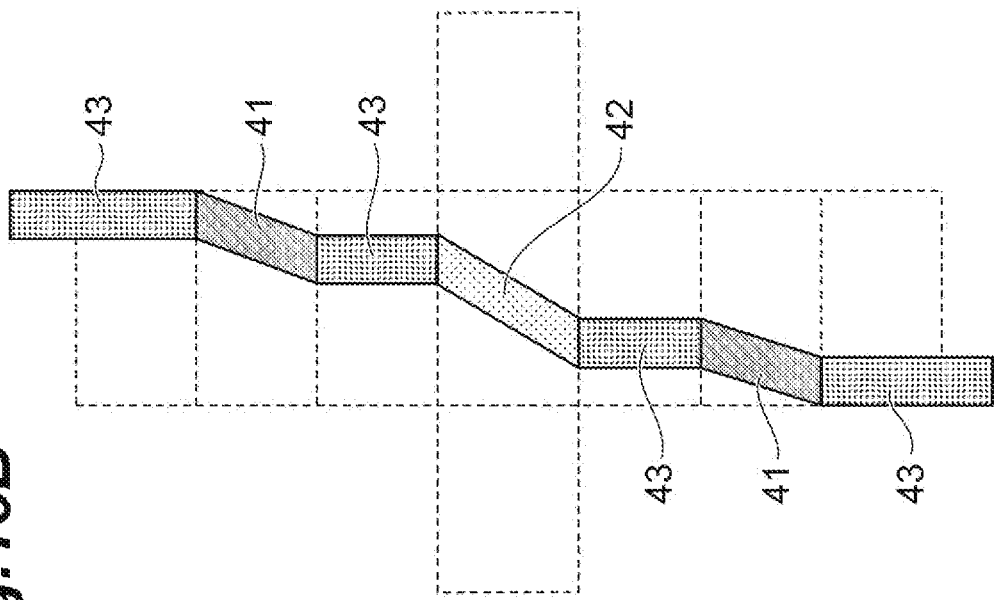
FIG. 15A is a schematic unfolded view of the coil in the comparative example.
Figure 15B:
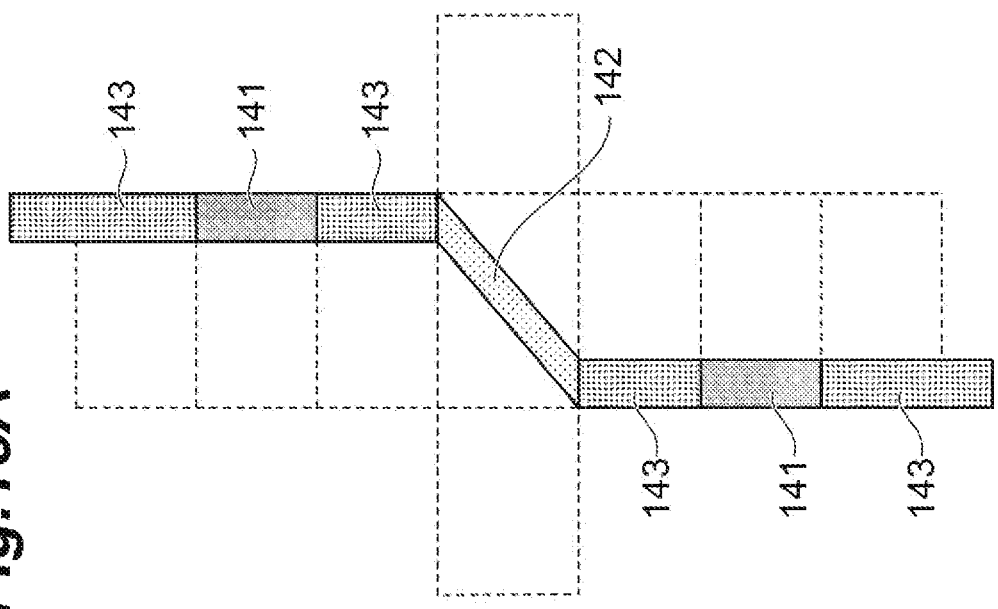
FIG. 15B is a schematic unfolded view of the coil in the electronic component.
Figure 16:
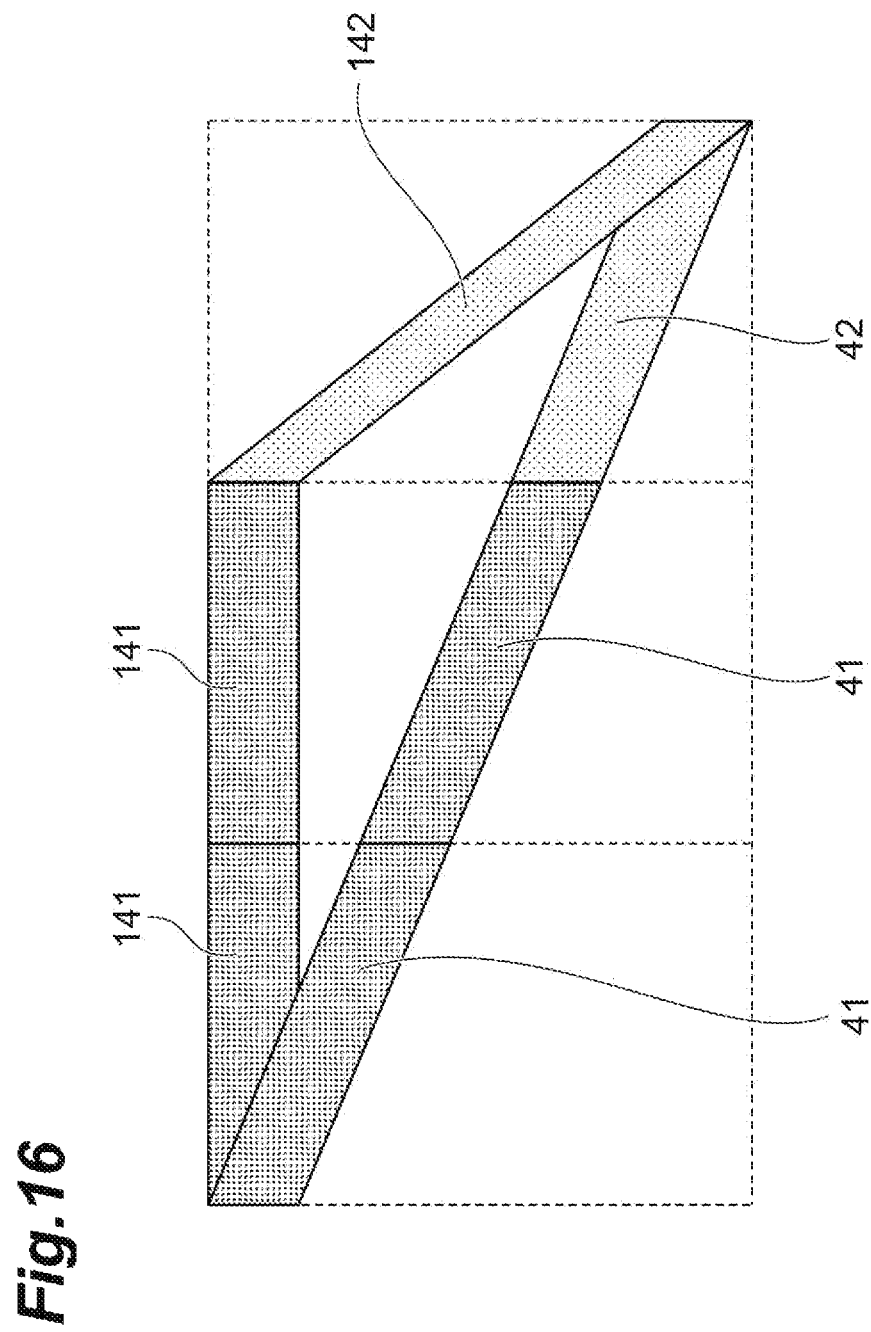
FIG. 16 is a view illustrating a difference in length between the coil in the comparative example and the coil of the electronic component.

FIGS. 14A, 14B, 15A, 15B, and 16 are views for describing a difference in electric current path between an example and a comparative example of the electronic component in the present embodiment. FIG. 14A is a schematic perspective view of a coil 125 in the comparative example. FIG. 14B is a schematic perspective view of the coil 25 in the electronic component 1. FIG. 15A is a schematic unfolded view of the coil 125 in the comparative example. FIG. 15B is a schematic unfolded view of the coil 25 in the electronic component 1. FIG. 16 is a view illustrating a difference in length between the coil 125 in the comparative example and the coil 25 of the electronic component 1.

The coil 125 includes a pair of conductor layers 141, a conductor layer 142, and a plurality of connection conductors 143. The pair of conductor layers 141 correspond to the conductor layers 41 adjacent to each other in the coil 25. The conductor layer 142 corresponds to the conductor layer 42 of the coil 25. The plurality of connection conductors 143 correspond to the plurality of connection conductors 43 of the coil 25.

As illustrated in FIG. 14A, in the coil 125, an extending direction of each of the conductor layers 141 and an extending direction of the conductor layer 142 are along the X-axis direction that is orthogonal to a coil axis AX25 and that is along the insulator layers. Namely, when viewed in the Z-axis direction, each of the conductor layers 141 extends along the X-axis direction. For this reason, when the coil 125 is unfolded, as illustrated in FIG. 15A, the conductor layer 141 and the connection conductors 143 extend on the same straight line, and only the conductor layer 142 is inclined to the conductor layer 141 and the connection conductors 143.

On the other hand, as illustrated in FIG. 14B, in the coil 25, the extending direction of each of the conductor layers 41 and the extending direction of the conductor layer 42 are inclined to the X-axis direction that is orthogonal to the coil axis AX25 and that is along the insulator layers 10. For this reason, when the coil 25 is unfolded, as illustrated in FIG. 15B, in addition to the conductor layer 42, the pair of conductor layers 41 are inclined to the connection conductors 43. In this case, as illustrated in FIG. 16, a length of the coil 25 is shorter than a length of the coil 125, and an electric current path of the coil 25 is shorter than an electric current path of the coil 125. FIG. 16 is a view comparing a length of a combination of the pair of conductor layers 41 and the connection conductors 42 and a length of a combination of the pair of conductor layers 141 and the connection conductors 142.

In the electronic component 1, the electric current path in the coil 25 is shorter than the electric current path in the coil 125, and inductance of the coil 25 can be more reduced than inductance of the coil 125. According to such a configuration, for example, even when inductance is increased by other elements by the amount that inductance is reduced by the ensuring of the width of the conductor layers 41 and 42 and by the disposition of the conductor layers 41 and 42, a desired inductance is ensured. For example, a cross-sectional area of the coil 25 can be increased compared to a cross-sectional area of the coil 125 without changing the coil 125 and inductance. The cross-sectional area of the coil 25 corresponds to, for example, an area of the region R2. When the cross-sectional area of the coil 25 is increased, magnetic fluxes generated by the coil 25 can be increased.

The plurality of conductor layers 41 include the pair of conductor layers 61 and 62. The pair of conductor layers 61 and 62 are connected to each other through the conductor layer 42. In this case, the length of the electric current path in the coil 25 can be reduced in a simpler configuration.

The pair of conductor layers 61 and 62 are the conductor layers 41 adjacent to each other in the direction along the coil axis AX5 among the plurality of conductor layers 41. In this case, the length of the electric current path in the coil can be reduced in a simpler configuration.

The conductor layer 41 and the conductor layer 42 connected to each other through the connection conductor 43 are line-symmetrically disposed when viewed in the stacking direction. In this case, electric current easily flows in a distributed manner, and loss of electric current can be reduced. When electric current flows in a distributed manner, electric current density decreases, and a Q value of the coil 25 is also improved.

Each of the conductor layers 41 includes the pair of end portions 41a and 41b located opposite each other. The plurality of connection conductors 43 include the connection conductor 51 and the connection conductor 52. The connection conductor 51 and the connection conductor 52 are connected to the end portion 41a. In this case, electric current can flow through the connection conductor 51 and through the connection conductor 52 in a distributed manner, and loss of electric current can be further reduced. In this case, the Q value of the coil can also be further improved.

The conductor layer 41 and the conductor layer 42 corresponding to each other among the plurality of conductor layers 41 and a plurality of the conductor layers 42 are connected to each other through the connection conductor 51 and through the connection conductor 52. The connection portion C11 at which the connection conductor 51 and the end portion 41a are connected to each other and the connection portion C12 at which the connection conductor 52 and the end portion 41a are connected to each other are arranged in the direction D3 inclined to the extending directions D1 and D2 of the conductor layers 41 and 42 connected to the connection conductors 51 and 52. In this case, electric current can flow through the connection conductor 51 and through the connection conductor 52 in a distributed manner and in a more balanced manner, and loss of electric current can be further reduced. In this case, the Q value of the coil can also be further improved.

The angle θ1 formed by the arrangement direction of the connection portion C11 and the connection portion C12 in the conductor layer 41 and the extending direction D1 of the conductor layer 41 may be equal to the angle θ2 formed by the arrangement direction of the connection portion C11 and the connection portion C12 in the conductor layer 41 and the extending direction D2 of the conductor layer 42. In this case, electric current can flow through the connection conductor 51 and through the connection conductor 52 in a distributed manner and in a more balanced manner, and loss of electric current can be further reduced. In this case, the Q value of the coil can also be further improved.

In the configuration in which the plurality of connection conductors 73 are connected to one end portion 71a of the conductor layer 71, a space in which the plurality of connection conductors 73 are disposed needs to be ensured in the conductor layer 71. For example, when viewed in the stacking direction, ensuring a predetermined distance between the connection conductors 73 adjacent to each other is required, and when viewed in the stacking direction, ensuring a predetermined distance between an edge of the conductor layer 71 and the connection conductor 73 is also required. For example, ensuring a distance of 20 μm or more and 300 μm or less between the connection conductors 73 adjacent to each other is required. When the distance between the connection conductors 73 adjacent to each other is less than 20 μm, a crack occurs in the element body 2, which is a problem. In the example illustrated in the present embodiment, the distance between the connection conductors 73 adjacent to each other is 60 μm. For example, ensuring a distance of 0 μm or more and 100 μm or less between an edge of the conductor layer 71 and the connection conductor 73 is required. In a case where a predetermined distance between the edge of the conductor layer 71 and the connection conductor 73 when viewed in the stacking direction is ensured, even when a connection position between the conductor layer 71 and the connection conductor 73 is offset during manufacturing, a variation in characteristics of the coil 27 can be suppressed. The smaller the distance between the edge of the conductor layer 71 and the connection conductor 73 when viewed in the stacking direction is, the more the width of the conductor layer 71 can be reduced. For this reason, the smaller the distance between the edge of the conductor layer 71 and the connection conductor 73 when viewed in the stacking direction is, the more the characteristics of the coil 27 can be improved.

In the coil 27 of the electronic component 1, the connection portion C21 and the connection portion C22 are arranged in the direction D14 inclined to the extending direction D11 of the conductor layer 71. In this case, electric current can flow through the connection conductor 81 and through the connection conductor 82 in a distributed manner. For this reason, electric current density in the conductor layer 71 decreases, and a Q value of the coil can be improved. Further, the width of the conductor layer 71 in the direction D13 that is orthogonal to the extending direction D11 of the conductor layer 71 and that is along the insulator layers 10 can be reduced. Therefore, according to the electronic component 1, it is possible to achieve both the realization of desired characteristics and the compactness of the electronic component 1.

The coil 27 includes at least one conductor layer 72. The conductor layer 72 is disposed at a position different from that of the at least one conductor layer 71 in the stacking direction. The conductor layer 72 extends in the direction D12 that is inclined to the extending direction D11 of the at least one conductor layer 71 and that is along the insulator layers. The conductor layer 72 includes the end portions 72a and 72b located opposite each other. The end portion 71a and the end portion 72a are connected to each other by each of the connection conductors 81 and 82. In this case, electric current can also flow through the coil 27 including the conductor layer 72 in a distributed manner.

The arrangement direction of the connection portion C21 and the connection portion C22 and the extending direction D12 of the conductor layer 72 intersect each other. In this case, electric current can flow through the conductor layer 72 in a more distributed manner.

In the direction along the coil axis AX7, the connection portion C21 is closer to the end portion 72b than the connection portion C22. In the extending direction D11 of the conductor layer 71, the connection portion C21 is further apart from the end portion 71b than the connection portion C22. In this case, electric current can flow through the conductor layer 72 in a more distributed manner.

In the conductor layer 71, the angle θ7 formed by the arrangement direction of the connection portion C21 and the connection portion C22 and the extending direction D11 of the conductor layer 71 is 80 degrees or less. In this case, the width of the conductor layer 71 in the direction D13 that is orthogonal to the extending direction D11 of the conductor layer 71 and that is along the insulator layers 10 can be further reduced.

The plurality of connection conductors 73 further include the connection conductors 83 and 84. The connection conductors 83 and 84 are connected to the same end portion 71a of the conductor layer 71 connected to the connection conductors 81 and 82. The connection conductor 83 and the conductor layer 71 are connected to each other at the connection portion C23. The connection conductor 84 and the conductor layer 71 are connected to each other at the connection portion C24. In the conductor layer 71, the connection portion C23 and the connection portion C24 are arranged in the direction D15 inclined to the extending direction D11 of the conductor layer 71. In this case, electric current can also flow through the connection conductor 83 and through the connection conductor 84 in a distributed manner. In such a configuration as well, the width of the conductor layer 71 in the direction D13 that is orthogonal to the extending direction D11 of the conductor layer 71 and that is along the insulator layers 10 can be reduced.

The arrangement direction of the connection portion C21 and the connection portion C22 and the arrangement direction of the connection portion C23 and the connection portion C24 intersect each other. The position at which the arrangement direction of the connection portion C21 and the connection portion C22 and the arrangement direction of the connection portion C23 and the connection portion C24 intersect each other is located between the connection portion C21 and the connection portion C23 when viewed in the direction along the coil axis AX7. In this case, a large cross-sectional area of the coil 27 can be ensured.

The connection portion C23 and the connection portion C24 are arranged in the direction D14 along the arrangement direction of the connection portion C21 and the connection portion C22. In this case, electric current can flow in a more distributed manner.

The at least one conductor layer 71 includes the pair of conductor layers 91 and 92. The pair of conductor layers 91 and 92 are electrically connected to each other through the plurality of connection conductors 73 and through the at least one conductor layer 72. The pair of conductor layers 91 and 92 extend in the directions along each other when viewed in the stacking direction. The connection conductors 81 and 82 are connected to the respective end portions 71a of the pair of conductor layers 91 and 92. The connection conductors 83 and 84 are connected to at least one end portion 71b of the pair of conductor layers 91 and 92. In this case, the width of each of the pair of conductor layers 91 and 92 in the direction D13 that is orthogonal to the extending direction D11 of the conductor layer 71 and that is along the insulator layers 10 can be reduced.

The connection portion C21 and the connection portion C22 in one of the pair of conductor layers 91 and 92 are arranged in the direction D14 along the arrangement direction of the connection portion C21 and the connection portion C22 in the other of the pair of conductor layers 91 and 92. In this case, a larger cross-sectional area of the coil 27 can be ensured.

The connection conductors 83 and 84 are connected to the respective end portions 71b of the pair of conductor layers 91 and 92. The arrangement direction of the connection portion C21 and the connection portion C22 in the one of the pair of conductor layers 91 and 92 and the arrangement direction of the connection portion C23 and the connection portion C24 in the one of the pair of conductor layers 91 and 92 intersect each other. The connection portion C23 and the connection portion C24 in the one of the pair of conductor layers 91 and 92 are arranged in the direction D15 along the arrangement direction of the connection portion C23 and the connection portion C24 in the other of the pair of conductor layers 91 and 92. In this case, a larger cross-sectional area of the coil 27 can be ensured.

The embodiment and the modification examples of the present invention have been described above; however, the present invention is not necessarily limited to the embodiment and the modification examples described above, and various changes can be made without departing from the concept of the present invention.

For example, in the embodiment and the modification examples described above, the coils 21 and 23 may be coils wound around the respective coil axes a plurality of times. For example, when the coil 21 is wound around the coil axis AX1 a plurality of times, a plurality of conductor layers 31 may be arranged along the coil axis AX1. In this case, the coil 21 may further include at least one conductor layer that is disposed at a position different from that of the plurality of conductor layers 31 in the stacking direction, and that is connected to each of the conductor layers 31 through the connection conductor 32. For example, when the coil 23 is wound around the coil axis AX3 a plurality of times, a plurality of conductor layers 34 may be arranged along the coil axis AX3. In this case, the conductor layers 34 adjacent to each other may be connected to each other by a connection conductor extending in the stacking direction.

In the embodiment and the modification examples described above, a case where two connection conductors 43 are connected to each of the same end portions 41a and 41b has been described. However, three or more connection conductors 43 may be connected to each of the same end portions 41a and 41b.

In the embodiment and the modification examples described above, a case where two connection conductors 73 are connected to each of the same end portions 71a and 71b has been described. However, three or more connection conductors 73 may be connected to each of the same end portions 71a and 71b.

The positions of the conductor layer 41 and the conductor layer 42 may be interchanged in the Z-axis direction. In other words, the conductor layer 41 may be disposed at a position closer to the mounting surface than the position of the conductor layer 42. Similarly, the positions of the conductor layer 71 and the conductor layer 72 may be interchanged in the Z-axis direction. In other words, the conductor layer 71 may be disposed at a position closer to the mounting surface than the position of the conductor layer 72.

In the present embodiment and the modification examples, a configuration in which the coils 21 and 23, the coil 25, and the coil 27 are disposed inside one element body 2 has been described. However, a combination of the coils provided in the electronic component 1 is not limited to the configuration. The electronic component 1 may include only the coil 21 and the coil 23 as coils. The electronic component 1 may include only the coil 25 as a coil. The electronic component 1 may include only the coil 27 as a coil. The electronic component 1 may be configured such that the coils 21, 23, 25, 27, and 29 are appropriately combined.

In the example described with reference to FIG. 8, the coil 27 or other coils may be disposed at the position of the coil 25. In this case, it is preferable that the coil disposed at the position of the coil 25 forms a coil axis along a direction intersecting the coil axis AX3 of the coil 23. Further, it is preferable that the coil disposed at the position of the coil 25 forms a coil axis along a direction orthogonal to the coil axis AX3 of the coil 23. In these cases, a magnetic field between the coil and the coil 23 is unlikely to be affected.

What is claimed is:

1. An electronic component comprising:
   an element body including a plurality of insulator layers that are stacked; and
   a coil disposed inside the element body, and forming a coil axis along a direction orthogonal to a stacking direction of the plurality of insulator layers,
   wherein the coil includes a plurality of conductor layers extending in a direction that intersects the coil axis and that is along the insulator layers, and a plurality of connection conductors each being connected to a corresponding conductor layer among the plurality of conductor layers and each extending in the stacking direction,
   the plurality of conductor layers includes a plurality of first conductor layers arranged along the coil axis, and at least one second conductor layer that is disposed at a position different from a position of the plurality of first conductor layers in the stacking direction, and that is connected to a corresponding first conductor layer among the plurality of first conductor layers through the connection conductor,
   in the conductor layers adjacent to each other in a direction along the coil axis among the plurality of conductor layers, a width in a direction orthogonal to an extending direction of each of the conductor layers is larger than a shortest distance between the conductor layers adjacent to each other, and
   an extending direction of each of the first conductor layers and an extending direction of the at least one second conductor layer intersect each other when viewed in the stacking direction, and are inclined to a direction that is orthogonal to the coil axis and that is along the insulator layers.

2. The electronic component according to claim 1, wherein the plurality of first conductor layers include a pair of the first conductor layers connected to each other through the second conductor layer.

3. The electronic component according to claim 2, wherein the pair of first conductor layers are the conductor layers adjacent to each other in the direction along the coil axis among the plurality of conductor layers.

4. The electronic component according to claim 1, wherein the first conductor layer and the second conductor layer connected to each other through the connection conductor are line-symmetrically disposed when viewed in the stacking direction.

5. The electronic component according to claim 1, wherein each of the conductor layers includes a pair of end portions located opposite each other,
   the plurality of connection conductors include a first connection conductor and a second connection conductor, and
   the first connection conductor and the second connection conductor are connected to at least one of the pair of end portions.

6. The electronic component according to claim 5, wherein among the plurality of first conductor layers and the at least one second conductor layer, the first conductor layer and the second conductor layer corresponding to each other are connected to each other through the first connection conductor and through the second connection conductor, and
   a first connection portion at which the first connection conductor and the end portion are connected to each other and a second connection portion at which the second connection conductor and the end portion are connected to each other are arranged in a direction inclined to the extending directions of the first conductor layer and the second conductor layer connected to the first connection conductor and to the second connection conductor.

7. The electronic component according to claim 6, wherein an angle formed by an arrangement direction of the first connection portion and the second connection portion in the first conductor layer and the extending direction of the first conductor layer is equal to an angle formed by an arrangement direction of the first connection portion and the second connection portion in the second conductor layer and the extending direction of the second conductor layer.

* * * * *